United States Patent
Li et al.

(10) Patent No.: US 7,470,635 B2
(45) Date of Patent: *Dec. 30, 2008

(54) METHOD OF DEPOSITING A SILICON DIOXIDE-COMPRISING LAYER IN THE FABRICATION OF INTEGRATED CIRCUITRY, METHODS OF FORMING TRENCH ISOLATION IN THE FABRICATION OF INTEGRATED CIRCUITRY, METHODS OF DEPOSITING SILICON DIOXIDE-COMPRISING LAYERS IN THE FABRICATION OF INTEGRATED CIRCUITRY, AND METHODS OF FORMING BIT LINE OVER CAPACITOR ARRAYS OF MEMORY CELLS

(75) Inventors: Weimin Li, Shanghai (CN); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 330 days.

This patent is subject to a terminal disclaimer.

(21) Appl. No.: 11/378,825

(22) Filed: Mar. 17, 2006

(65) Prior Publication Data

US 2006/0160375 A1    Jul. 20, 2006

Related U.S. Application Data

(63) Continuation of application No. 10/806,923, filed on Mar. 22, 2004, now Pat. No. 7,053,010.

(51) Int. Cl.
*H01L 21/31* (2006.01)
*H01L 21/469* (2006.01)

(52) U.S. Cl. ................... 438/787; 257/E21.278

(58) Field of Classification Search ............... 438/787; 257/E21.278
See application file for complete search history.

(56) References Cited

U.S. PATENT DOCUMENTS 3,809,574 A    5/1974    Duffy et al.

(Continued)

FOREIGN PATENT DOCUMENTS

EP    0817251 A    1/1998

(Continued)

OTHER PUBLICATIONS

PCT/US2004/021156, Dec. 12, 2005, IPER.

(Continued)

*Primary Examiner*—Asok K Sarkar
(74) *Attorney, Agent, or Firm*—Wells St. John P.S.

(57) ABSTRACT

This invention includes methods of depositing silicon dioxide comprising layers in the fabrication of integrated circuitry, methods of forming trench isolation, and methods of forming bit line over capacitor arrays of memory cells. In one implementation, a semiconductor substrate having an exposed outer first surface comprising silicon-nitrogen bonds and an exposed outer second surface comprising at least one of silicon and silicon dioxide is provided. A layer comprising a metal is deposited over at least the outer second surface. A silanol is flowed to the metal of the outer second surface and to the outer first surface effective to selectively deposit a silicon dioxide comprising layer over the outer second surface as compared to the outer first surface. Other aspects and implementations are contemplated.

34 Claims, 13 Drawing Sheets

U.S. PATENT DOCUMENTS

| | | |
|---|---|---|
| 3,990,927 A | 11/1976 | Montier |
| 4,474,975 A | 10/1984 | Clemons et al. |
| 4,836,885 A | 6/1989 | Breiten et al. |
| 5,105,253 A | 4/1992 | Pollock |
| 5,156,881 A | 10/1992 | Okano et al. |
| 5,182,221 A | 1/1993 | Sato |
| 5,387,539 A | 2/1995 | Yang et al. |
| 5,410,176 A | 4/1995 | Liou et al. |
| 5,470,798 A | 11/1995 | Ouellet |
| 5,516,721 A | 5/1996 | Galli et al. |
| 5,518,959 A | 5/1996 | Jang et al. |
| 5,565,376 A | 10/1996 | Lur et al. |
| 5,604,149 A | 2/1997 | Paoli et al. |
| 5,616,513 A | 4/1997 | Shepard |
| 5,702,977 A | 12/1997 | Jang et al. |
| 5,719,085 A | 2/1998 | Moon et al. |
| 5,741,740 A | 4/1998 | Jang et al. |
| 5,770,469 A | 6/1998 | Uram et al. |
| 5,776,557 A | 7/1998 | Okano et al. |
| 5,786,039 A | 7/1998 | Brouquet |
| 5,786,263 A | 7/1998 | Perera |
| 5,801,083 A | 9/1998 | Yu et al. |
| 5,863,827 A | 1/1999 | Joyner |
| 5,883,006 A | 3/1999 | Iba |
| 5,888,880 A | 3/1999 | Gardner et al. |
| 5,895,253 A | 4/1999 | Akram |
| 5,895,255 A | 4/1999 | Tsuchiaki |
| 5,904,540 A | 5/1999 | Sheng et al. |
| 5,923,073 A | 7/1999 | Aoki et al. |
| 5,930,645 A | 7/1999 | Lyons et al. |
| 5,930,646 A | 7/1999 | Gerung et al. |
| 5,943,585 A | 8/1999 | May et al. |
| 5,950,094 A | 9/1999 | Lin et al. |
| 5,960,299 A | 9/1999 | Yew et al. |
| 5,972,773 A | 10/1999 | Liu et al. |
| 5,976,949 A | 11/1999 | Chen |
| 5,981,354 A | 11/1999 | Spikes et al. |
| 5,989,978 A | 11/1999 | Peidous |
| 5,998,280 A | 12/1999 | Bergemont et al. |
| 6,013,583 A | 1/2000 | Ajmera et al. |
| 6,030,881 A | 2/2000 | Papasouliotis et al. |
| 6,033,961 A | 3/2000 | Xu et al. |
| 6,051,477 A | 4/2000 | Nam |
| 6,069,055 A | 5/2000 | Ukeda et al. |
| 6,090,675 A | 7/2000 | Lee et al. |
| 6,127,737 A | 10/2000 | Kuroi et al. |
| 6,156,674 A | 12/2000 | Li et al. |
| 6,171,962 B1 | 1/2001 | Karlsson et al. |
| 6,187,651 B1 | 2/2001 | Oh |
| 6,190,979 B1 | 2/2001 | Radens et al. |
| 6,191,002 B1 | 2/2001 | Koyanagi |
| 6,245,641 B1 | 6/2001 | Shiozawa et al. |
| 6,265,282 B1 | 7/2001 | Lane et al. |
| 6,300,219 B1 | 10/2001 | Doan et al. |
| 6,326,282 B1 | 12/2001 | Park et al. |
| 6,329,266 B1 | 12/2001 | Hwang et al. |
| 6,331,380 B1 | 12/2001 | Ye et al. |
| 6,355,966 B1 | 3/2002 | Trivedi |
| 6,448,150 B1 | 9/2002 | Tsai et al. |
| 6,455,394 B1 | 9/2002 | Iyer et al. |
| 6,524,912 B1 | 2/2003 | Yang et al. |
| 6,534,395 B2 | 3/2003 | Werkhoven et al. |
| 6,583,028 B2 | 6/2003 | Doan et al. |
| 6,583,060 B2 | 6/2003 | Trivedi |
| 6,607,959 B2 | 8/2003 | Lee et al. |
| 6,617,251 B1 | 9/2003 | Kamath et al. |
| 6,674,132 B2 | 1/2004 | Willer |
| 6,719,012 B2 | 4/2004 | Doan et al. |
| 6,821,865 B2 | 11/2004 | Wise et al. |
| 6,930,058 B2 | 8/2005 | Hill et al. |
| 6,933,225 B2 | 8/2005 | Werkhoven et al. |
| 7,033,909 B2 | 4/2006 | Kim et al. |
| 7,053,010 B2 | 5/2006 | Lie et al. |
| 7,141,278 B2 | 11/2006 | Koh et al. |
| 2001/0006255 A1 | 7/2001 | Kwon et al. |
| 2001/0006839 A1 | 7/2001 | Yeo |
| 2001/0041250 A1 | 11/2001 | Werkhoven et al. |
| 2001/0046753 A1 | 11/2001 | Gonzales et al. |
| 2002/0000195 A1 | 1/2002 | Bang et al. |
| 2002/0004284 A1 | 1/2002 | Chen |
| 2002/0018849 A1 | 2/2002 | George et al. |
| 2003/0032281 A1 | 2/2003 | Werkhoven et al. |
| 2003/0129826 A1 | 7/2003 | Werkhoven et al. |
| 2004/0016987 A1 | 1/2004 | Sawada et al. |
| 2004/0032006 A1 | 2/2004 | Yun et al. |
| 2004/0082181 A1 | 4/2004 | Doan et al. |
| 2004/0209484 A1 | 10/2004 | Hill et al. |
| 2004/0266153 A1 | 12/2004 | Hu |
| 2005/0009293 A1 | 1/2005 | Kim et al. |
| 2005/0009368 A1 | 1/2005 | Vaartstra |
| 2005/0054213 A1 | 3/2005 | Derderian et al. |
| 2005/0079730 A1 | 4/2005 | Beintner et al. |
| 2005/0112282 A1 | 5/2005 | Gordon et al. |
| 2005/0124171 A1 | 6/2005 | Vaarstra |
| 2005/0142799 A1 | 6/2005 | Seo |

FOREIGN PATENT DOCUMENTS

| | | |
|---|---|---|
| EP | 959493 | 11/1999 |
| JP | 02277253 A | 11/1990 |
| JP | 05-315441 | 11/1993 |
| JP | 06-334031 | 12/1994 |
| JP | 146224 | 1/1996 |
| WO | 02/27063 A2 | 4/2002 |
| WO | PCT/US2004/021156 | 6/2004 |

OTHER PUBLICATIONS

Beekmann et al., *Sub-micron Gap Fill and In-Situ Planarisation using FlowfillJ Technology*, Electrotech 1-7 ULSI Conference, Portland, OR (Oct. 1995).

Chen et al., *Excimer Laser-Induced Ti Silicidation to Eliminate the Fine-Line Effect for Integrated Circuity Device Fabrication*, 149 Journal of Electrochemical Society, No. 11, pp. G609-G612 (2002).

Curtis et al., *APCVD TEOS: O3 Advanced Trench Isolation Applications*, Semiconductor Fabtech, 9th Ed., pp. 241-247 (pre-Jul. 2003).

Disclosed Anonymous 32246, *Substrate Contact with Closed Bottom Trenches*, Research Disclosure, 1 page (Feb. 1991).

Gasser et al., *Quasi-monolayer deposition of silicon dioxide*, Elsevier Science S.A., pp. 213-218 (1994).

George, S.M. et al., *Atomic layer controlled deposition of $SiO_2$ and $Al_2O_3$ using ABAB . . . reaction sequence chemistry*, 82/83 Applied Surface Science, pp. 460-467 (Jul. 10, 1994).

PCT/US2004/021156, Jun. 2004, Written Opinion.

Hausmann et al., *Catalytic vapor deposition of highly conformal silica nanolaminates*, Department of Chemistry and Chemical Biology, Harvard University, pp. 1-13 (May 14, 2002).

Hausmann et al., *Rapid Vapor Deposition of Highly Conformal Silica Nanolaminates*, 298 Science, pp. 402-406 (Oct. 11, 2002).

Horie et al., *Kinetics and Mechanism of the Reactions of $O(^3P)$ with $SiH_4$, $CH_3SiH_3$, $(CH_3)_2SiH_2$, and $(CH_3)_3SiH$*, 95 J. Phys. Chem., pp. 4393-4400 (1991).

Joshi et al., *Plasma Deposited Organosilicon Hydride Network Polymers as Versatile Resists for Entirely Dry Mid-Deep UV Photolithography*, 1925 SPIE, pp. 709-720 (Jan. 1993).

Kiermasz et al., *Planarisation for Sub-Micron Devices Utilising a New Chemistry*, Electrotech 1-2, DUMIC Conference, California (Feb. 1995).

Klaus et al., *Atomic Layer Deposition of $SiO_2$ Using Catalyzed and Uncatalyzed Self-Limiting Surface Reactions*, 6 Surface Review and Letters, Nos. 3 and 4, pp. 435-448 (1999).

Kojima et al., *Planarization Process Using a Multi-Coating of Spin-on-Glass,* V-MIC Conference, pp. 390-396 (Jun. 13-14, 1988).

Matsuura et al., *A Highly Reliable Self-planarizing Low-k Intermetal Dielectric for Sub-quarter Micron Interconnects,* 97 IEEE, pp. 785-788 (Jul. 1997).

Matsuura et al., *Novel Self-planarizing CVD Oxide for Interlayer Dielectric Applications;* 94 IEEE, pp. 117-120 (1994).

McClatchie et al. *Low Dielectric Constant FlowfillJ Technology for IMD Applications,* 7 pages (pre-Aug. 1999).

Miller et al., *Self-limiting chemical vapor deposition of an ultra-thin silicon oxide film using tri-*(tert-*butoxy*) *Silanol,* 397 Thin Solid Films, pp. 78-82 (2001).

Morishita et al. *Atomic-layer chemical-vapor-deposition of silicon-nitride,* 112 Applied Surface Science, pp. 198-204 (1997).

Nishiyama et al., *Agglomeration Resistant Self-Aligned Silicide Process Using $N_2$ Implantation into $TiSl_2$,* 36 Jpn. J. Appl. Phys., Part 1, No. 6A, pp. 3639-3643 (Jun. 1997).

Shareef et al., *Subatmospheric chemical vapor deposition ozone/ TEOS process for $SiO_2$ trench filling,* 13 J. Vac. Sci. Technol. B, Part 4, pp. 1888-1892 (Jul./Aug. 1995).

Withnall et al., *Matrix Reactions of Methylsilanes and Oxygen Atoms,* 92 J. Phys. Chem., pp. 594-602 (1988).

Wolf, *Chapter 13: Polycides and Salicides of TiSix, CoSi2, and NiSi,* Silicon Processing for the VLSI Era, vol. IV, pp. 603-604 (pre-2003).

Yokoyama et al. *Atomic layer controlled deposition of silicon nitride and* in situ *growth observation by infrared reflection absorption spectroscopy,* 112 Applied Surface Science, pp. 75-81 (1997).

U.S. Appl. No. 10/806,923, filed Mar. 2004, Li et al.

U.S. Appl. No. 10/931,524, filed Aug. 2004, Sandhu.

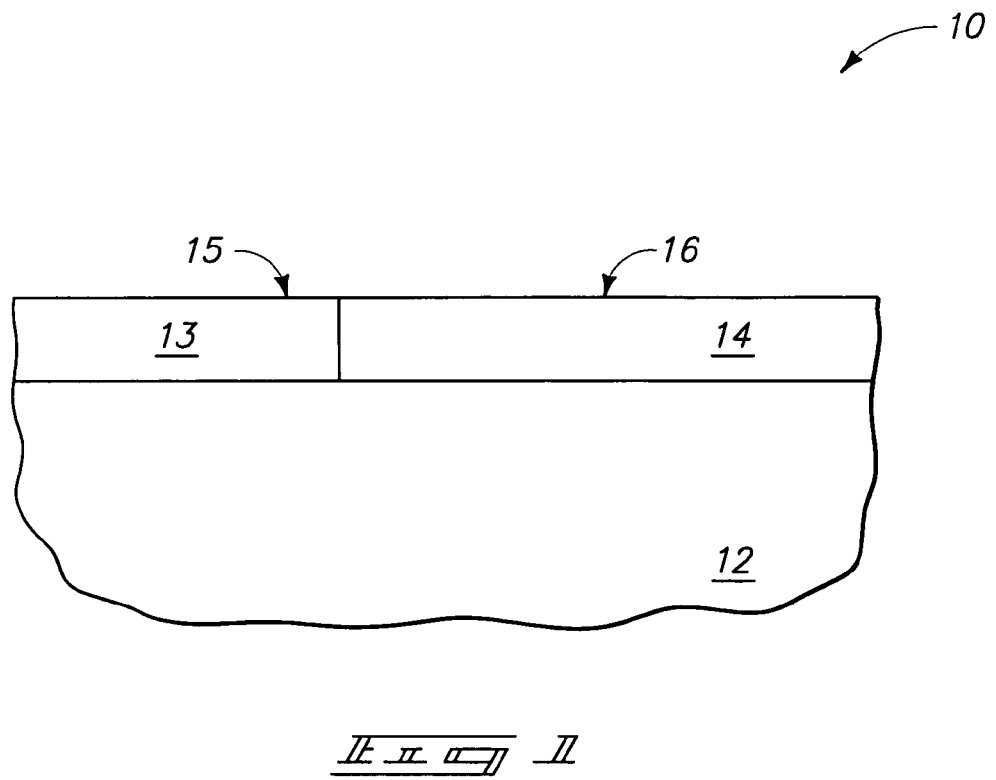
_Fig. 1_
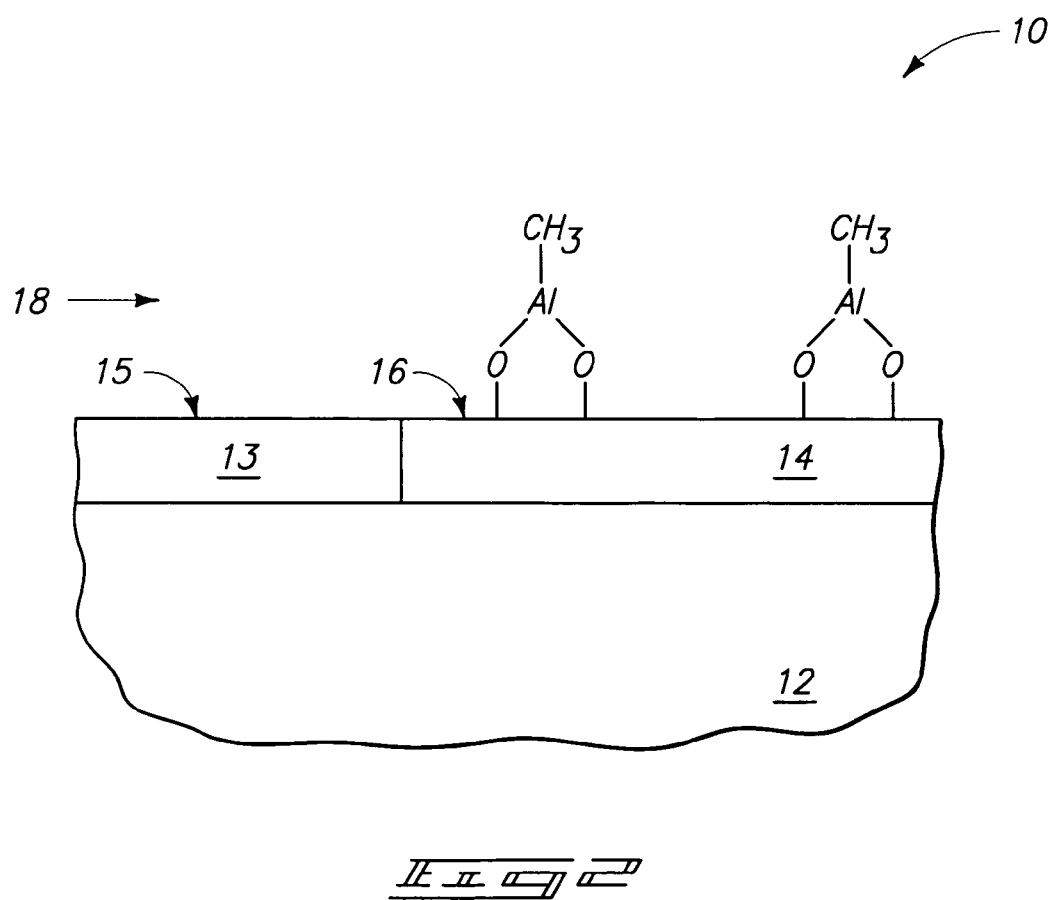
_Fig. 2_

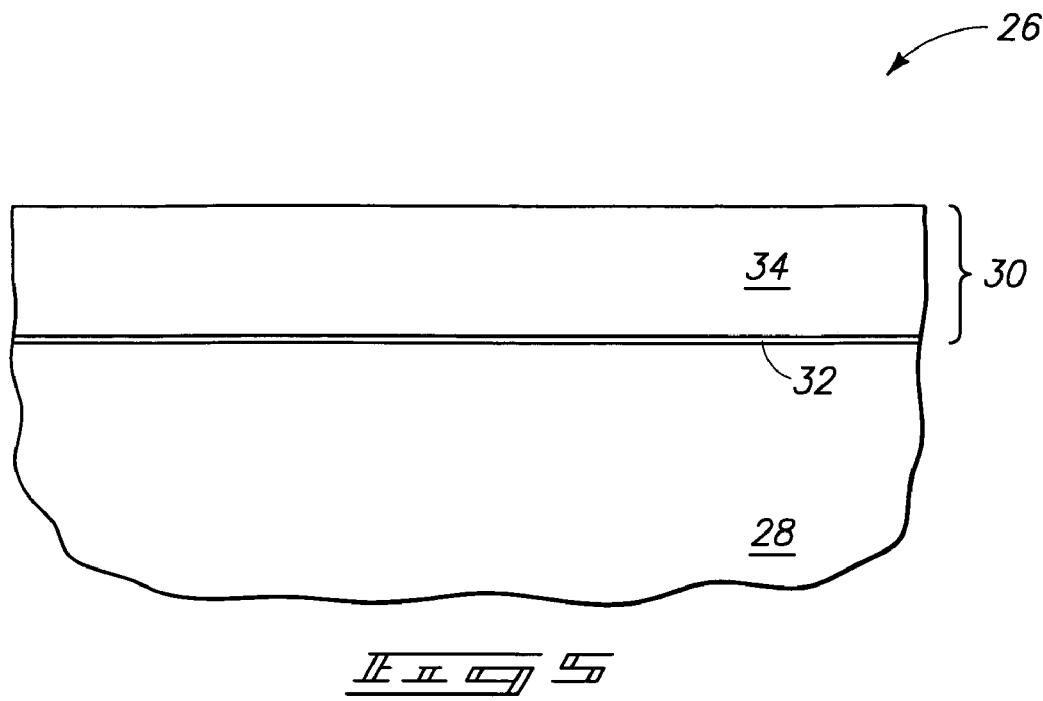
_Fig 5_
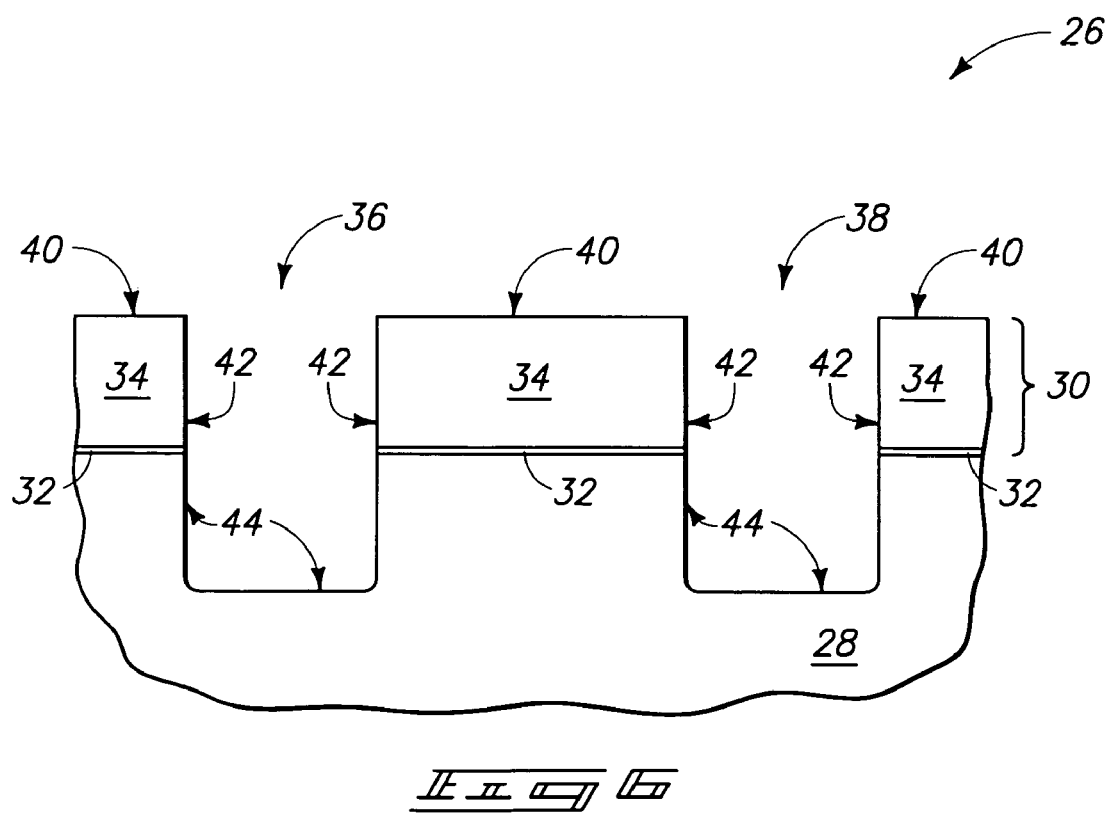
_Fig 6_

US 7,470,635 B2

METHOD OF DEPOSITING A SILICON DIOXIDE-COMPRISING LAYER IN THE FABRICATION OF INTEGRATED CIRCUITRY, METHODS OF FORMING TRENCH ISOLATION IN THE FABRICATION OF INTEGRATED CIRCUITRY, METHODS OF DEPOSITING SILICON DIOXIDE-COMPRISING LAYERS IN THE FABRICATION OF INTEGRATED CIRCUITRY, AND METHODS OF FORMING BIT LINE OVER CAPACITOR ARRAYS OF MEMORY CELLS

RELATED PATENT DATA

This patent resulted from a continuation application of U.S. patent application Ser. No. 10/806,923, filed Mar. 22, 2004, now U.S. Pat. No. 7,053,010 entitled "Methods of Depositing Silicon Dioxide Comprising Layers in the Fabrication of Integrated Circuitry, Methods of Forming Trench Isolation, and Methods of Forming Arrays of Memory Cells", naming Weimin Li and Gurtej S. Sandhu as inventors, the disclosure of which is incorporated by reference.

TECHNICAL FIELD

This invention relates to methods of depositing silicon dioxide comprising layers in the fabrication of integrated circuitry, to methods of forming trench isolation, and to methods of forming arrays of memory cells.

BACKGROUND OF THE INVENTION

Two dielectric or insulating materials commonly used in the fabrication of integrated circuitry are silicon dioxide and silicon nitride. These materials can be used alone, in combination with each other, and/or in combination with other materials, including property modifying dopants. Another common material utilized in semiconductor processing is silicon, for example in amorphous, monocrystalline and polycrystalline forms. Such material can be conductively doped with conductivity modifying impurities, for example to provide p-type electrical conduction or n-type electrical conduction.

In certain instances of integrated circuitry fabrication, a substrate in process might have outwardly exposed surfaces of different compositions. For example, any combination of silicon dioxide comprising, silicon-nitrogen bond comprising and silicon comprising materials might be outwardly exposed at the same time at some point during fabrication of the circuitry.

SUMMARY OF THE INVENTION

This invention includes methods of depositing silicon dioxide comprising layers in the fabrication of integrated circuitry, methods of forming trench isolation, and methods of forming arrays of memory cells. In one implementation, a semiconductor substrate having an exposed outer first surface comprising silicon-nitrogen bonds and an exposed outer second surface comprising at least one of silicon and silicon dioxide is provided. A layer comprising a metal is deposited over at least the outer second surface. A silanol is flowed to the metal of the outer second surface and to the outer first surface effective to selectively deposit a silicon dioxide comprising layer over the outer second surface as compared to the outer first surface.

In one implementation, a semiconductor substrate having a field effect transistor gate construction is provided. The gate construction comprises an insulative cover comprising an exposed outer first surface comprising silicon-nitrogen bonds. The semiconductor substrate is provided to comprise an exposed outer second surface proximate the gate construction comprising at least one of silicon and silicon dioxide. A gaseous silicon containing precursor and a gaseous oxygen containing precursor are flowed to the first and second surfaces effective to selectively deposit a substantially undoped silicon dioxide comprising diffusion barrier layer over the outer second surface as compared to the outer first surface.

In one implementation, a method of forming a bit line over capacitor array of memory cells includes forming a layer comprising silicon-nitrogen bonds over an outer capacitor cell electrode. Bit contact openings are etched through the layer comprising silicon-nitrogen bonds and through the outer capacitor cell electrode. The layer comprising silicon-nitrogen bonds is provided to have an exposed elevationally outermost first surface comprising silicon-nitrogen bonds, and the bit contact openings are provided to comprise bases comprising an exposed second surface comprising at least one of silicon and silicon dioxide. A silicon dioxide comprising layer is selectively deposited over the outer second surface as compared to the outer first surface.

In one implementation, a method of forming a bit line over capacitor array of memory cells includes forming a layer comprising silicon-nitrogen bonds over an outer capacitor cell electrode, with the outer capacitor electrode comprising polysilicon. Bit contact openings are etched through the layer comprising silicon-nitrogen bonds and through the outer capacitor cell electrode. The layer comprising silicon-nitrogen bonds is provided to have an exposed elevationally outer first surface comprising silicon-nitrogen bonds, and the bit contact openings are provided to comprise outer capacitor electrode sidewall portions comprising polysilicon. A silicon dioxide comprising layer is selectively deposited over the polysilicon comprising sidewall portions as compared to the outer first surface.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that shown by FIG. 1.

FIG. 5 is a diagrammatic sectional view of a semiconductor wafer fragment in process in accordance with an aspect of the invention.

FIG. 6 is a view of the FIG. 5 wafer fragment at a processing step subsequent to that shown by FIG. 5.

DETAILED DESCRIPTION OF THE PREFERRED EMBODIMENTS

Figure 3:
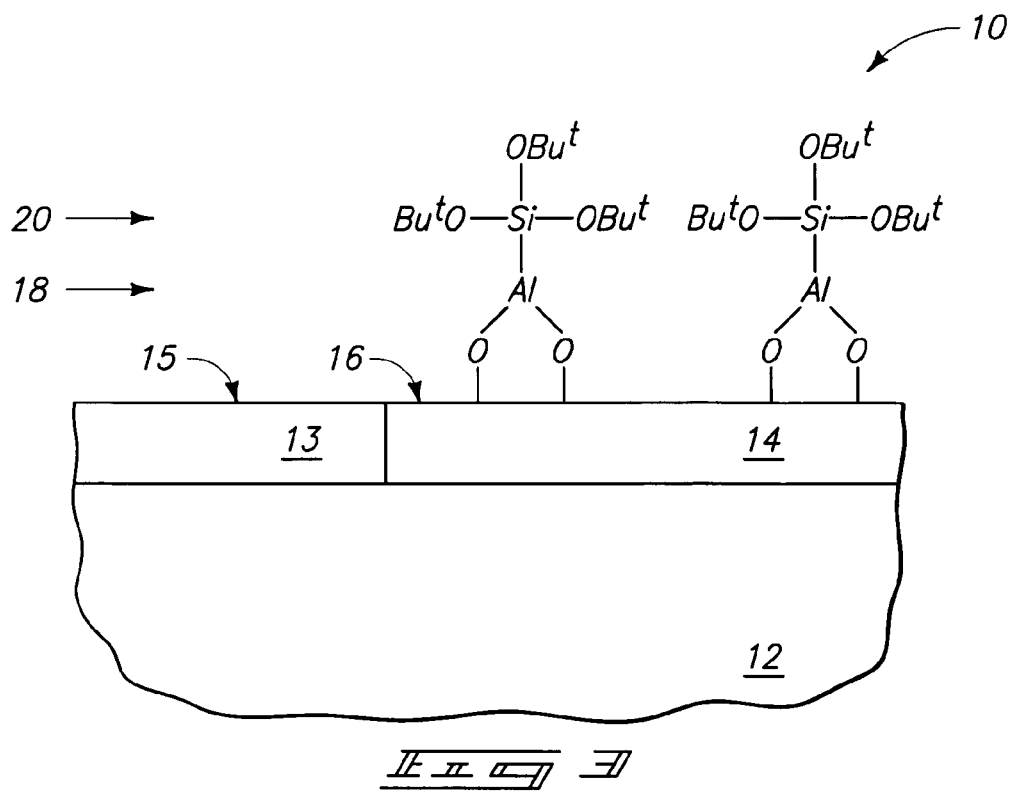
FIG. 3 is a view of the FIG. 2 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

An exemplary method of depositing a silicon dioxide comprising layer in the fabrication of integrated circuitry is described in a first exemplary embodiment with respect to FIGS. 1-4. Referring to FIG. 1, an exemplary semiconductor substrate 10 includes a bulk monocrystalline substrate 12. Any other semiconductor substrate is contemplated, including silicon-on-insulator, and/or employing other semiconductive materials. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural unless otherwise indicated. Materials 13 and 14 are formed over base substrate 12. In accordance with the continuing discussion, material 13 comprises silicon-nitrogen bonds, and material 14 comprises at least one of silicon (meaning elemental form silicon in amorphous and/or crystalline forms, including polycrystalline and/or monocrystalline) and silicon dioxide. By way of example only, preferred silicon-nitrogen bond containing materials are silicon nitride and silicon oxynitride ($SiO_xN_y$). Materials 13 and 14 might comprise, consist essentially of, or consist of their respective one or more materials. Further, multiple layers of different materials are of course contemplated. Regardless, substrate 10 can be considered as having an exposed outer first surface 15 comprising silicon-nitrogen bonds and an exposed outer second surface 16 comprising at least one of silicon and silicon dioxide. If silicon, such might be amorphous and/or crystalline, for example monocrystalline silicon and/or polycrystalline silicon for outer surface 16.

Referring to FIG. 2, a layer 18 comprising a metal is deposited over at least outer second surface 16. The metal might be comprised in elemental or alloy form, but more likely will be in a metal compound form, for example as shown. Regardless, exemplary preferred metals include any of aluminum, yttrium, zirconium, hafnium and mixtures thereof. The invention in one aspect contemplates using an aluminum metal compound comprising methyl aluminum and aluminum oxide, for example the chemisorbed Al—O—$CH_3$ species, as shown. Such can be formed by chemical vapor deposition, atomic layer deposition or any other deposition, whether existing or yet-to-be developed. An example technique to produce the illustrated FIG. 2 construction includes atomic layer deposition whereby at least outer surface 16 is initially hydroxylated to form pending/chemisorbed OH groups. Trimethylaluminum or aluminum dimethylamide, for example, can then be provided to produce the illustrated layer 18, for example as described in Hausmann et al., *Rapid Vapor Deposition of Highly Conformal Silica Nanolaminates*, SCIENCE Magazine, Vol. 298, pp. 402-406 (2002). Such might produce the layer 18 as shown, and might also produce alternately, or in combination therewith, a dimethylaluminide molecule with the aluminum atoms bonded to a single oxygen atom pending from the substrate. Other aluminum containing materials are of course contemplated. Regardless, in one preferred implementation the aluminum layer which is formed would preferably be no more than 4 monolayers thick, and perhaps most preferably only be about a single monolayer (preferably saturated) thick. Regardless, any other possibility employing aluminum or other metal is also of course contemplated. Metal might also deposit atop outer surface 15 (not shown). By way of example only and at least when using trimethylaluminum, a preferred substrate temperature is from 250° C. to 400° C. A preferred chamber pressure is from 0.1 Torr to 500 Torr. A preferred time for the trimethylaluminum pulse is from 0.5 second to 1 second, with the trimethylaluminum preferably being fed to the chamber at room temperature. An exemplary post-trimethyl aluminum purge is with Ar at 600 sccm for 30 seconds. A specific example to produce the illustrated layer 18 where second surface 16 comprises silicon dioxide includes a substrate temperature of 325° C., chamber pressure of 10 Torr, and a 1 second pulse of trimethylaluminum at room temperature.

It may be desired to have the depositing of the layer comprising metal (i.e., layer 18) be selective to deposit over the outer second surface (i.e., surface 16) as compared to the outer first surface (i.e., surface 15). Alternately, it may not necessarily be required that such a selective deposit occur to achieve the selective deposit of silicon dioxide described below. Regardless, if it is desired to have the depositing of the layer comprising metal to be selective to deposit over the outer second surface as compared to the outer first surface, it may be desirable to treat at least the outer second surface prior to said depositing effective to enhance the selective depositing of the layer comprising metal to deposit over the outer second surface as compared to the outer first surface. For example and by way of example only, the outer second surface might be hydrophilic and the outer first surface might be hydrophobic. Further, one or both of such surfaces might be pretreated to have such hydrophilic or hydrophobic characteristics. Regardless, exposure of at least the hydrophilic second surface to $H_2O$ can result in OH groups sorbing to the exposed second surface. If the hydrophobic surface is similarly exposed to $H_2O$, such OH groups won't likely sorb thereto due to the hydrophobicity. The sorbed OH groups on the second surface can enhance selectivity in depositing of the layer comprising metal thereto as compared to the exposed first surface, for example specifically with the aluminum metal compound species as described above.

Referring to FIG. 3, a silanol is flowed to the metal of outer second surface 16 and to the outer first surface 15. Exemplary preferred silanols include alkoxysilanols, which by definition includes any alkoxy silane alcohol, for example alkoxy silane diols and alkoxy silane triols. FIG. 3 depicts a layer 20 resulting from utilizing tristertbutoxysilanol.

Figure 4:
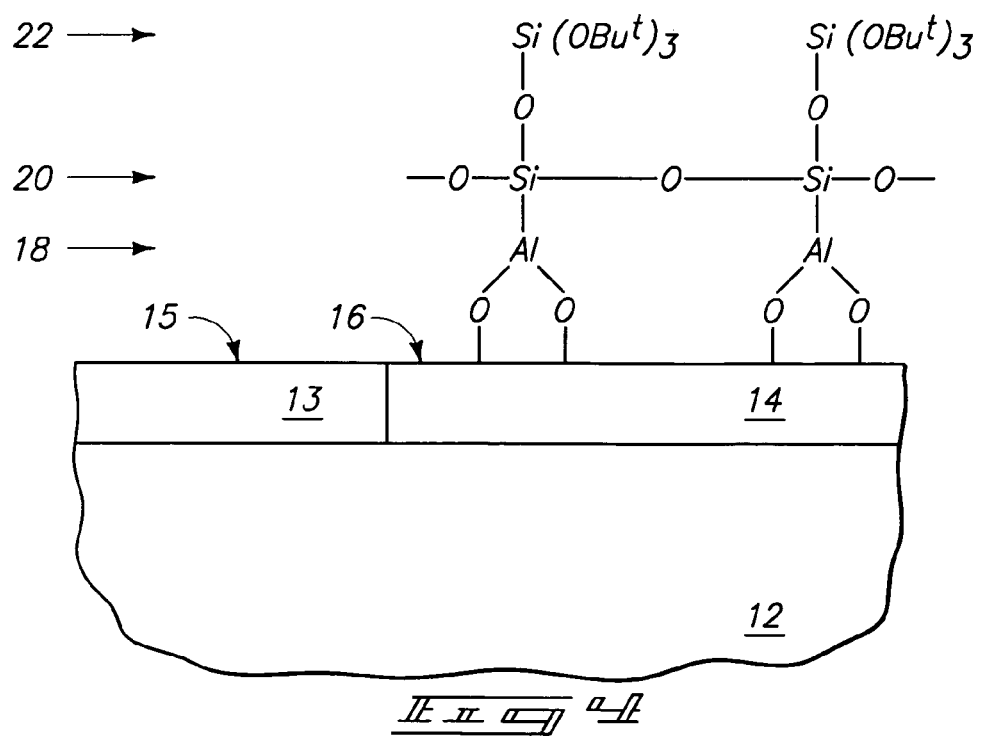
FIG. 4 is a view of the FIG. 3 wafer fragment at a processing step subsequent to that shown by FIG. 3.

Referring to FIG. 4, continuing exposure to such silanol results in formation of another layer 22. Continuing exposure results in the formation of more layers effective to selectively deposit a silicon dioxide comprising layer 20/22 over outer second surface 16 as compared to outer first surface 15. In the context of this document, a selective deposit of one material relative to another is at a ratio of at least 2:1. Preferably, the selective deposit is at a ratio of at least 5:1, more preferably at a ratio of at least 10:1, and even more preferably at a ratio of at least 50:1. Further most preferably, the selective deposit is at a ratio of at least 99:1 for at least the first 100 Angstroms of thickness of the silicon dioxide comprising layer, and more preferably for at least the first 250 Angstroms of thickness of the silicon dioxide comprising layer. Exemplary techniques for forming growing layer 20/22 are as described in the Hausmann et al. article referred to above. The silanol flowing to produce the exemplary FIG. 4 composition after producing the FIG. 3 composition might be continuous, for example at variable rates or at a substantially constant rate. Alternately by way of example only, the flowing of silanol after forming the FIG. 3 or other composition might be pulsed, meaning the result of discrete silanol pulsings having some time interval therebetween where no silanol is flowing to the surfaces. Preferred substrate temperature during the flowing is from 200° C. to 300° C., more preferably from 225° C. to 250° C., although other temperatures are contemplated. An exemplary preferred pressure range is from 0.1 Torr to 500 Torr. An exemplary example includes tristertbutoxysilanol feed for 60 seconds at 95° C., substrate temperature at 325° C., chamber pressure at 10 Torr, and followed by an Ar purge of 600 sccm for 60 seconds.

Such can result in a silicon dioxide comprising layer that is substantially amorphous, and self-limiting in growth to a thickness of about 500 Angstroms. In other words, continuing exposure to the silanol does not result in increasing growth of the silicon dioxide comprising layer being formed. In one implementation, essentially no measurable silicon dioxide comprising layer is formed on outer surface 15 of material 13. Accordingly, the deposit is self-limiting to silicon dioxide comprising deposition after completing depositing of the exemplary metal layer 18. However, the processing could be repeated, for example by depositing the layer comprising the metal again, and subsequently flowing the silanol to provide at least one more cycle. Of course, the cycling could be further repeated.

The above exemplary processing was generally and generically described relative to any semiconductor substrate having an exposed outer first surface comprising silicon-nitrogen bonds and an exposed outer second surface comprising at least one of silicon and silicon dioxide. Such is contemplated in the fabrication of any integrated circuitry whether existing or yet-to-be developed. By way of example only, such includes logic circuitry and memory circuitry comprising an array of memory cells. By way of example only, exemplary memory circuitry includes bit line over capacitor circuitry, capacitor over bit line circuitry, FLASH memory, etc. By way of example only, exemplary implementations of the above and other processings are described in additional embodiments, for example as next depicted by FIGS. 5-10. By way of example only, such depict exemplary methods of forming trench isolation in the fabrication of integrated circuitry. FIG. 5 shows a semiconductor substrate 26 comprising a bulk monocrystalline silicon or other semiconductive material substrate 28. A masking layer 30 comprising silicon-nitrogen bonds is formed over semiconductor substrate 28. Such is depicted as comprising a pad oxide layer 32 and an overlying silicon nitride comprising layer 34.

Referring to FIG. 6, isolation trenches 36 and 38 have been etched through silicon-nitrogen bond comprising masking layer 30 into the semiconductive material of substrate 28/26. Masking layer 30 is provided to have an exposed elevationally outermost first surface 40 comprising silicon nitride. In the depicted preferred embodiment, sidewall surfaces 42 also comprising silicon-nitrogen bonds are outwardly exposed. Isolation trenches 36, 38 within semiconductor substrate 28 comprise an exposed second surface 44 comprising at least one of silicon and silicon dioxide. For example, where substrate 28 comprises monocrystalline silicon, exposed second surfaces 44 might comprise monocrystalline silicon. Alternately by way of example only, surfaces 44 might comprise silicon dioxide, for example by exposing substrate 26 to thermal oxidizing conditions to form a silicon dioxide layer over/ as constituting surfaces 44 (not shown).

Figure 7:
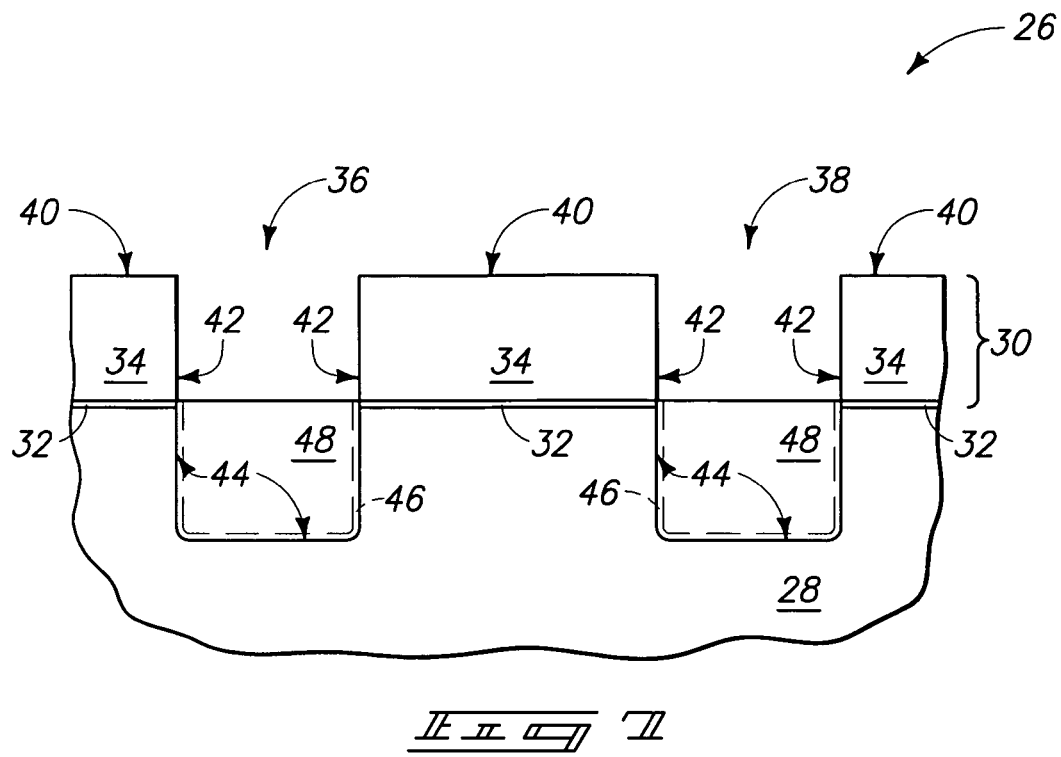
FIG. 7 is a view of the FIG. 6 wafer fragment at a processing step subsequent to that shown by FIG. 6.

Referring to FIG. 7, a layer 46 comprising metal has been deposited over at least outer second surface 44. Attributes as described above, for example with respect to layer 18 of the first described embodiment, are preferably utilized relative to the illustrated metal comprising layer 46. A silanol has been flowed to the metal of outer second surface 44 (in the form of layer 46) and to outer first surface 40 effective to selectively deposit a silicon dioxide comprising layer 48 over outer second surface 44 as compared to outer first surface 40. Exemplary preferred techniques are the same as those described above with reference to the first described embodiment with respect to the silanol flowing for forming growing layer 20/22. As shown, the selective depositing relative to isolation trenches 36 and 38 is effective to fill such isolation trenches within semiconductive material 28 of semiconductor substrate 26. FIG. 7 depicts a slight overfill of such trenches relative to material 28 at least in light of pad oxide layer 32 being received thereover. By way of example only, formation or growth of material 48 might be self limiting to about 500 Angstroms, or more or less, for a given deposition of a metal layer 46 before having to deposit another such layer to continue silicon dioxide material formation. In such a process if the trench depth within material 28 were 1000 Angstroms, such a process would be expected to completely fill that portion of the trenches within material 28 for formation of a single metal layer 26 due to growth/formation of material 48 from both the base and sidewall surfaces 44. The processing could also of course be conducted to only partially fill the trenches within material 28. Less preferred but also contemplated, deposition might continue substantially selectively upon material 48 to overfill trenches 36 and 38 along the sidewalls of silicon nitride material 34.

Figure 8:
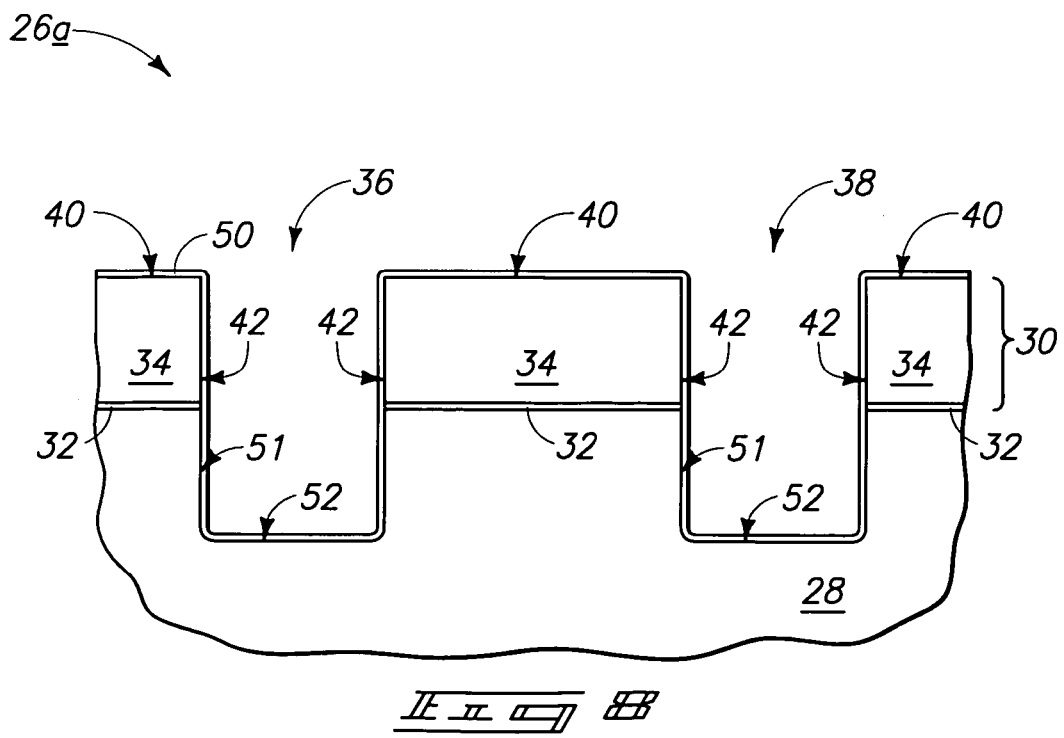
FIG. 8 is a view of the FIG. 6 wafer fragment at a processing step subsequent to that shown by FIG. 6.

An alternate exemplary embodiment to that of FIG. 7 is shown and described with reference to FIGS. 8-10. Like numerals from the second described embodiment are utilized where appropriate, with differences being indicated with the suffix "a" or with different numerals. FIG. 8 depicts the processing of a semiconductor substrate 26a subsequent to FIG. 6. A silicon nitride comprising trench liner 50 has been formed over the substrate, and more particularly at least over semiconductive material sidewalls 51 and semiconductive material bases 52 of isolation trenches 36 and 38. As shown, silicon nitride comprising trench liner 50 is formed on (meaning in physical contact with) semiconductive material sidewalls 51 and semiconductive material bases 52 of semiconductive material 28. Alternately by way of example only, an intervening additional layer, for example silicon dioxide, could be provided. An exemplary thickness for layer 50 is 50 Angstroms.

Figure 9:
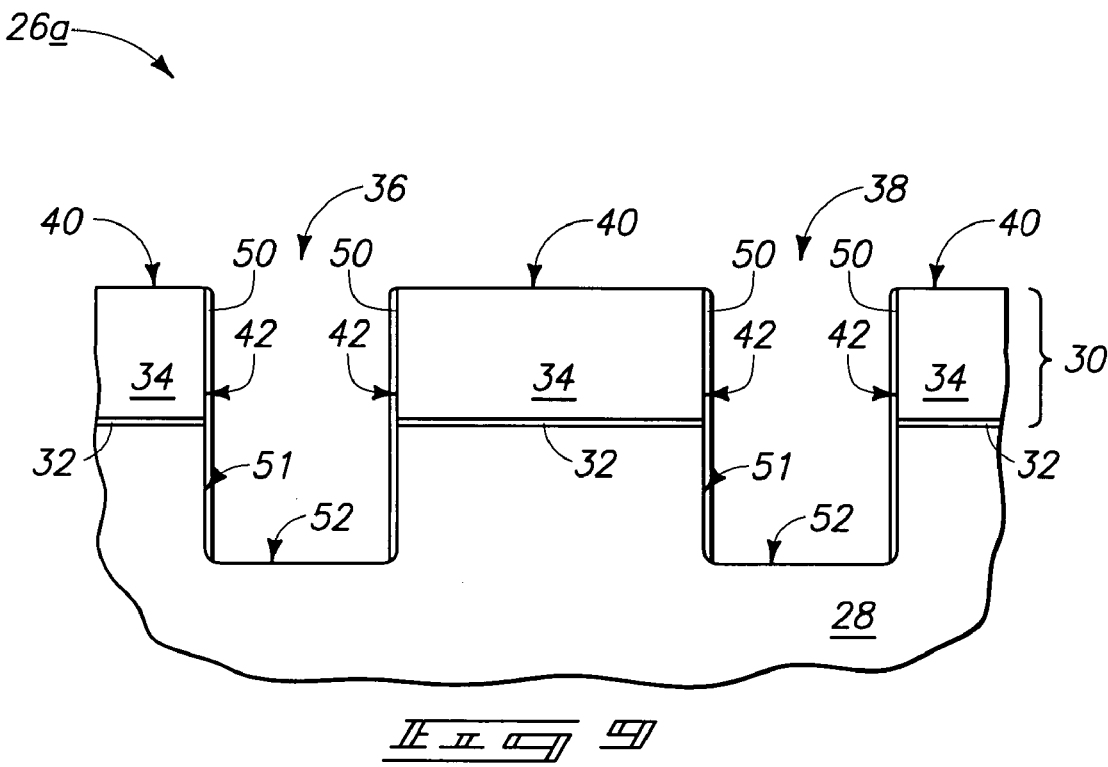
FIG. 9 is a view of the FIG. 8 wafer fragment at a processing step subsequent to that shown by FIG. 8.

Referring to FIG. 9, trench liner 50 has been anisotropically etched through over trench bases 52, and effective to leave trench liner material 50 over trench sidewalls 51. A thermal oxide or other layer (not shown) might also be formed. Regardless, FIG. 9 by way of example depicts providing silicon-nitrogen bond comprising masking layer 30 to have an exposed elevationally outermost first surface 40 comprising silicon-nitrogen bonds, and providing isolation trenches bases 52 to comprise an exposed second surface comprising at least one of silicon and silicon dioxide.

Figure 10:
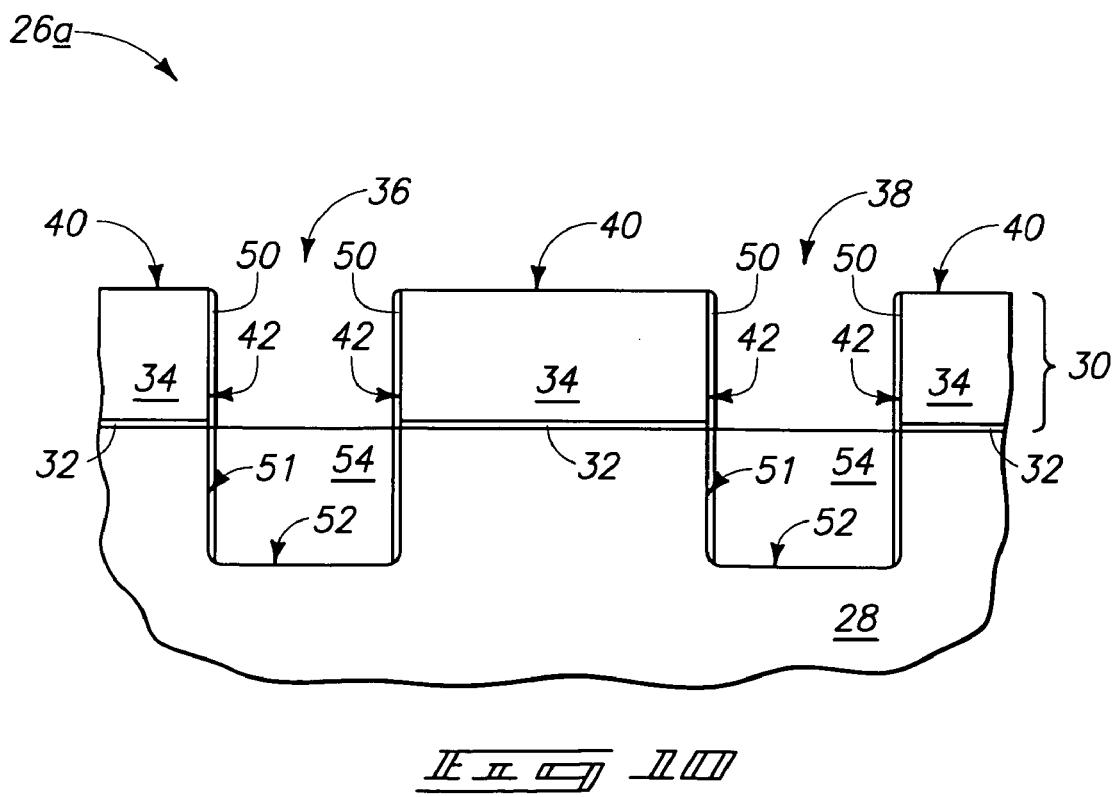
FIG. 10 is a view of the FIG. 9 wafer fragment at a processing step subsequent to that shown by FIG. 9.

Referring to FIG. 10, a silicon dioxide comprising layer 54 is selectively deposited over second surface 52, as compared to first surface 40. A preferred manner of doing so is as described above with respect to the first and second described embodiments, although any method which selectively deposits a silicon dioxide comprising layer over the second surface as compared to the outer first surface is also contemplated. Further in the depicted FIG. 10 exemplary embodiment, the selective depositing relative to isolation trenches 36 and 38 has been effective to no more than fill the isolation trenches within semiconductive material 28 of semiconductor substrate 26. Less preferred but also contemplated, deposition might continue substantially selectively upon material 54 to overfill trenches 36 and 38 along the material 50. Regardless, by way of example only at least when using the above described preferred metal layer deposit followed by silanol flowing, formation or growth of material 54 might be self limiting to about 500 Angstroms (or more or less) for a given deposition of a metal layer before having to deposit another such layer to continue silicon dioxide material formation.

By way of example only and not by way of limitation, the above exemplary second and third embodiments might provide advantages over existing trench isolation forming techniques. Such existing techniques typically deposit high density or other plasma deposited oxide within the trenches and over the masking layer, usually requiring planarization of the deposited trench filling material. Such is not necessarily utilized in the above exemplary second and third most preferred exemplary embodiments, particularly where trench filling with silicon dioxide material is to no more than fill (or only slightly overfill) the isolation trenches defined within the semiconductive material of the substrate.

Figure 11:
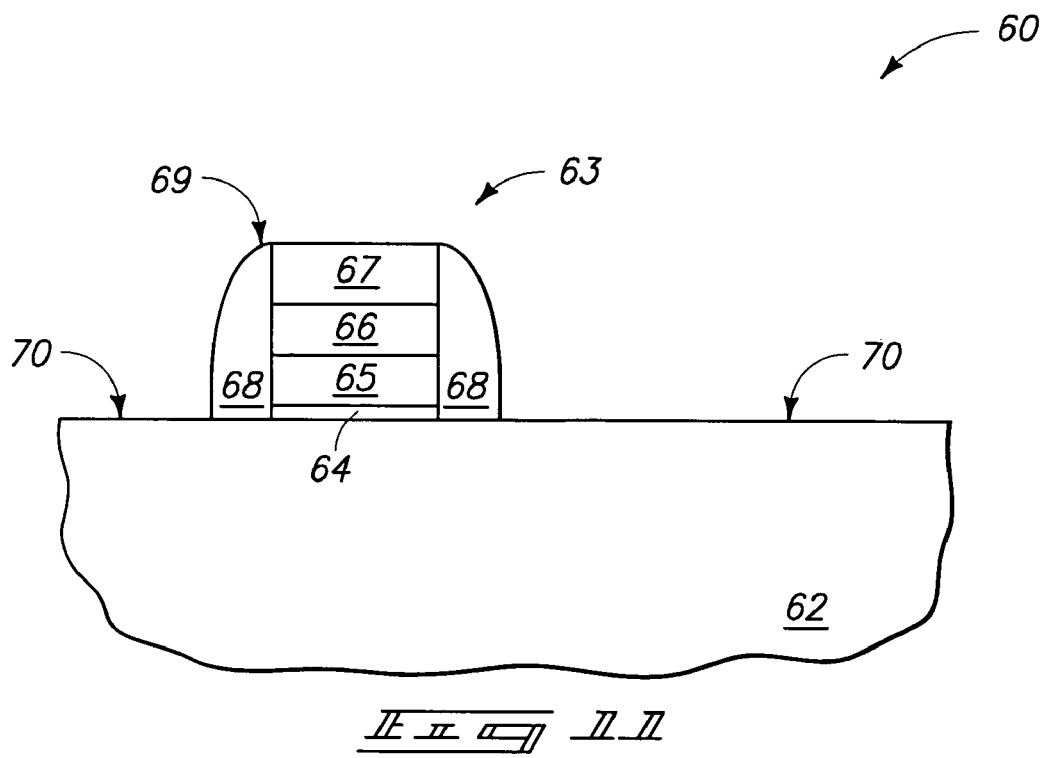
FIG. 11 is a diagrammatic sectional view of a semiconductor wafer fragment in process in accordance with an aspect of the invention.

By way of example only, another method of depositing a silicon dioxide comprising layer in the fabrication of integrated circuitry is described with reference to FIGS. 11-13. FIG. 11 depicts a semiconductor substrate 60 comprising some semiconductive material containing substrate 62. A field effect transistor gate construction 63 is formed over substrate 62. By way of example only, such is depicted as comprising a gate dielectric layer 64, an overlying conductively doped polysilicon layer 65, an overlying refractory metal or refractory metal silicide layer 66 (with layers 65 and 66 comprising an exemplary conductive region of the gate construction), and a silicon nitride comprising insulative cap 67. Anisotropically etched insulative sidewall spacers 68 are also shown as constituting outer sidewalls of gate construction 63. Spacers 68 and cap 67 can be considered as an insulative cover of the gate construction. Such comprises some exposed outer silicon-nitrogen bond comprising first surface 69 which, in the illustrated exemplary embodiment, covers all outer surfaces of the conductive region of the gate construction, but of course need not do so. Semiconductor substrate 60/62 is provided to comprise some exposed outer second surface 70 proximate gate construction 63 (with immediately adjacent thereto being shown by way of example only), and which comprises at least one of silicon and silicon dioxide.

Figure 12:
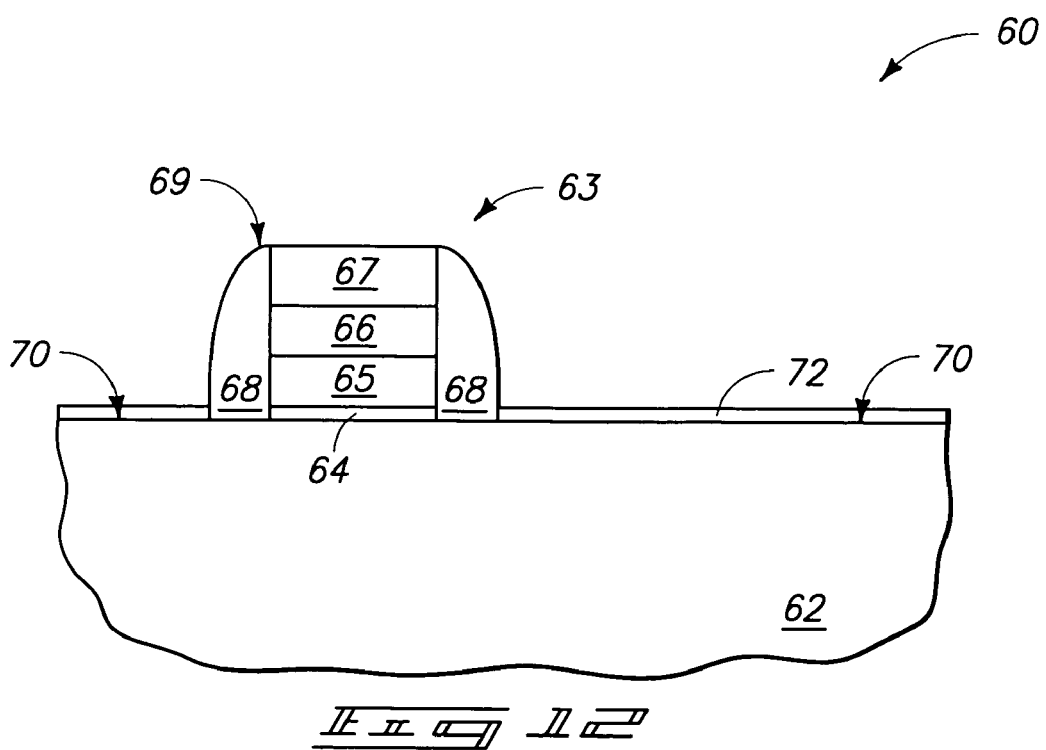
FIG. 12 is a view of the FIG. 11 wafer fragment at a processing step subsequent to that shown by FIG. 11.

Referring to FIG. 12, a gaseous silicon containing precursor and a gaseous oxygen containing precursor have been flowed to first surface 69 and second surface 70 effective to selectively deposit a substantially undoped silicon dioxide comprising diffusion barrier layer 72 over second outer surface 70 as compared to outer first surface 69. In the context of this document, "substantially undoped" with respect to a silicon dioxide comprising material means less than 1% by weight of either of boron or phosphorus doping. An exemplary preferred technique for doing so is as described above with respect to the first described embodiment, whereby a layer comprising a metal is deposited over at least the outer second surface and wherein a silanol is utilized. Such also provides an example wherein the oxygen and silicon containing precursors are in a single precursor (for example as is encompassed in a silanol). However alternately, the oxygen and silicon containing precursors might be encompassed by at least two precursors. All of the preferred attributes as described above with respect to the first preferred embodiment can preferably be utilized, although processing thereby is not limited in accordance with the broadest aspects of this implementation of an aspect of the invention.

Figure 13:
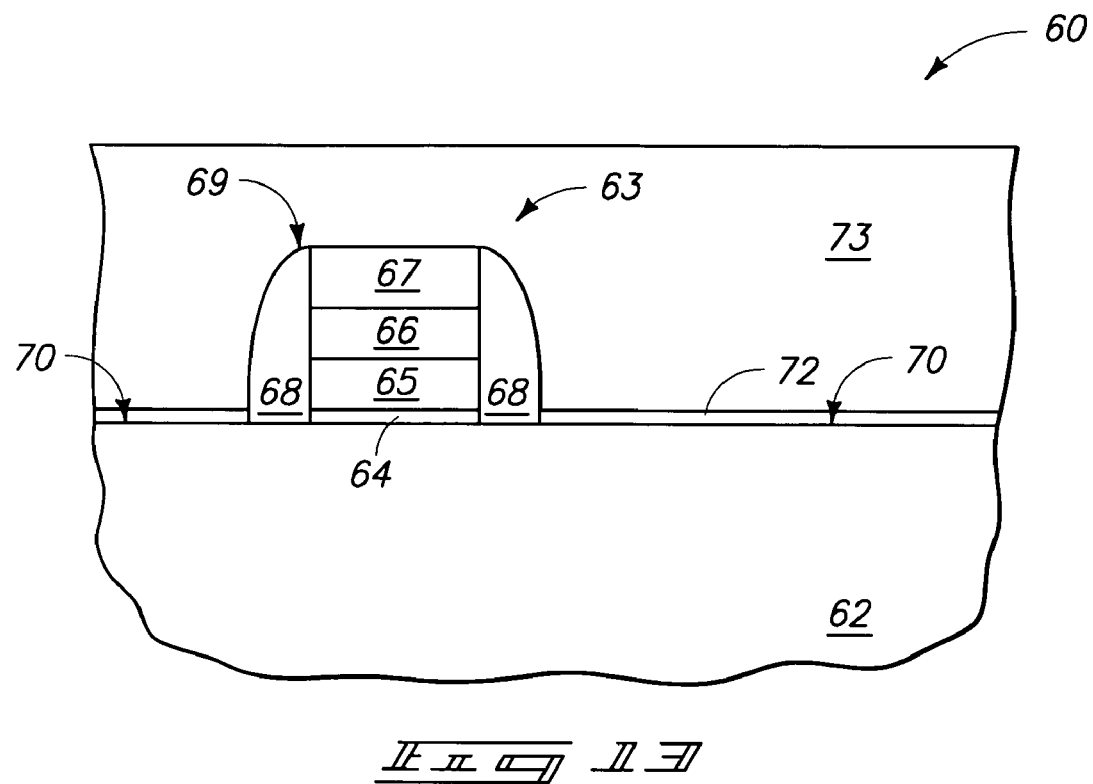
FIG. 13 is a view of the FIG. 12 wafer fragment at a processing step subsequent to that shown by FIG. 12.

Referring to FIG. 13, a doped silicon dioxide comprising layer 73 has been deposited on substantially undoped silicon comprising layer 72. Such is also depicted as having been planarized. An exemplary preferred material includes borophosphosilicate glass (BPSG).

Figure 14:
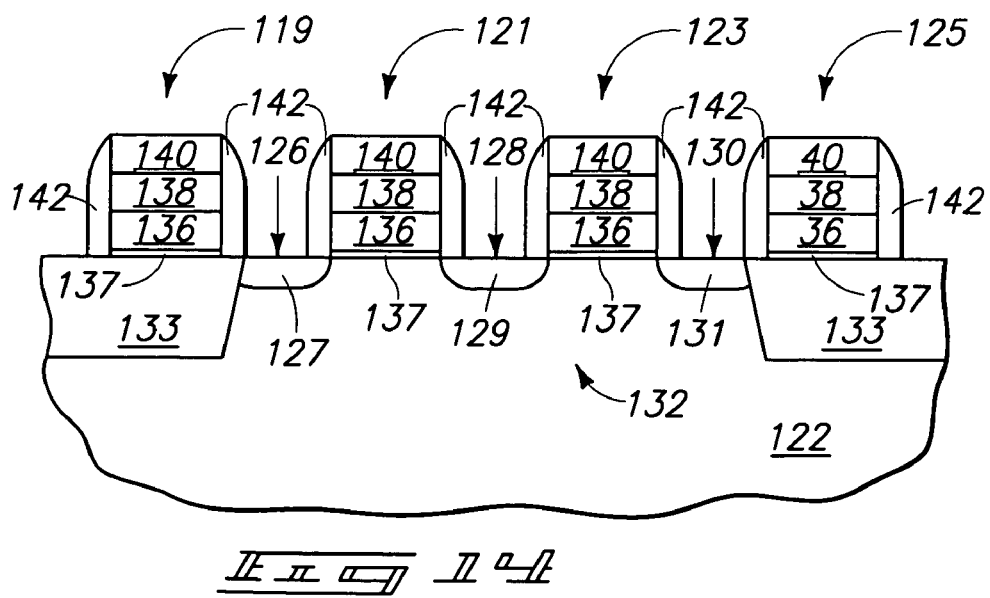
FIG. 14 is a diagrammatic sectional view of a semiconductor wafer fragment in process in accordance with an aspect of the invention.

Yet another alternate exemplary embodiment of a method of depositing a silicon dioxide comprising layer in the fabrication of integrated circuitry is described with reference to FIGS. 14-19. Such depicts an exemplary method of forming a bit line over capacitor array of memory cells. Referring to FIG. 14, a semiconductor wafer fragment in process is shown generally with reference numeral 110, and includes a semiconductive substrate 122. A plurality of spaced apart word lines 119, 121, 123 and 125 are formed over substrate 122, and in part, defines individual substrate locations 126, 128 and 130 with which electrical communication is desired. Substrate locations 126 and 130, on opposite sides of substrate location 128, constitute locations with which electrical communication will be established with individual storage capacitors. Substrate location 128 constitutes a location with which electrical communication will be established with a bit line. In a preferred embodiment as shown, substrate locations 126, 128 and 130 comprise diffusion regions 127, 129 and 131, respectively, which are received within substrate 122.

Word lines 119, 121, 123 and 125, and substrate locations 126, 128 and 130 are formed relative to an active area 132, which is isolated relative to other active areas by isolation regions 133, and which can be formed through conventional, inventive as described herein, or yet-to-be developed techniques. Each exemplary preferred embodiment word line is depicted as including a gate oxide layer 137, a polysilicon layer 136 and a silicide or higher conductive layer 138. An insulative cap 40 is provided, as are insulative sidewall spacers 42. Other word line constructions and/or materials can, of course, be utilized.

Figure 15:
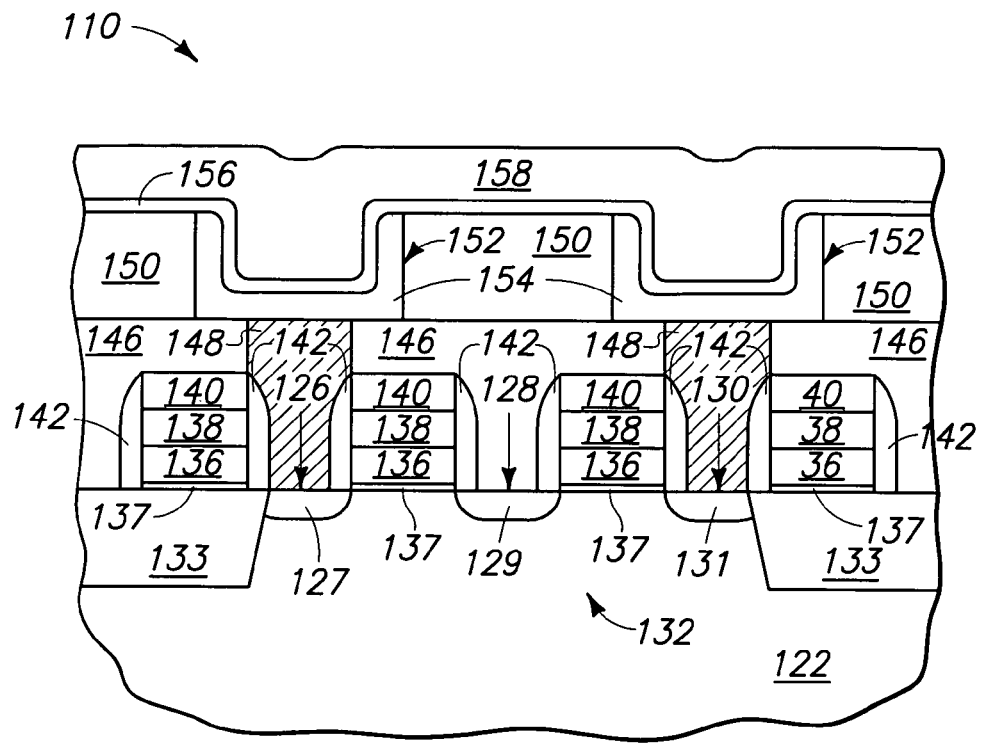
FIG. 15 is a view of the FIG. 14 wafer fragment at a processing step subsequent to that shown by FIG. 14.

Referring to FIG. 15, a planarized BPSG layer 146 has been formed. Preferably, an undoped silicon dioxide comprising layer (not shown) has been formed over the substrate prior to the deposition and planarization of insulative layer 146. A pair of conductive plugs 148 (i.e., conductively doped polysilicon) is formed within layer 146 over capacitor nodes 126/127 and 130/131. Barrier and/or glue layers could of course also be utilized. Another BPSG layer 150 has been formed over layer 146. Capacitor openings 152 have been formed therein. Such retain a storage node electrode 154, a capacitor dielectric region 156 and an outer capacitor cell electrode 158. Any conventional or yet-to-be developed materials and methods could be utilized. For reasons germane to preferred aspects of the invention, an exemplary preferred material for outer capacitor cell electrode 158 comprises polysilicon for a selective silicon dioxide comprising growth as described below. Regardless and by way of example only, FIG. 15 depicts provision of an outer capacitor cell electrode 158, which here is common to multiple capacitors although such is of course in no way required. Such may or may not be patterned at this point in the process.

Figure 16:
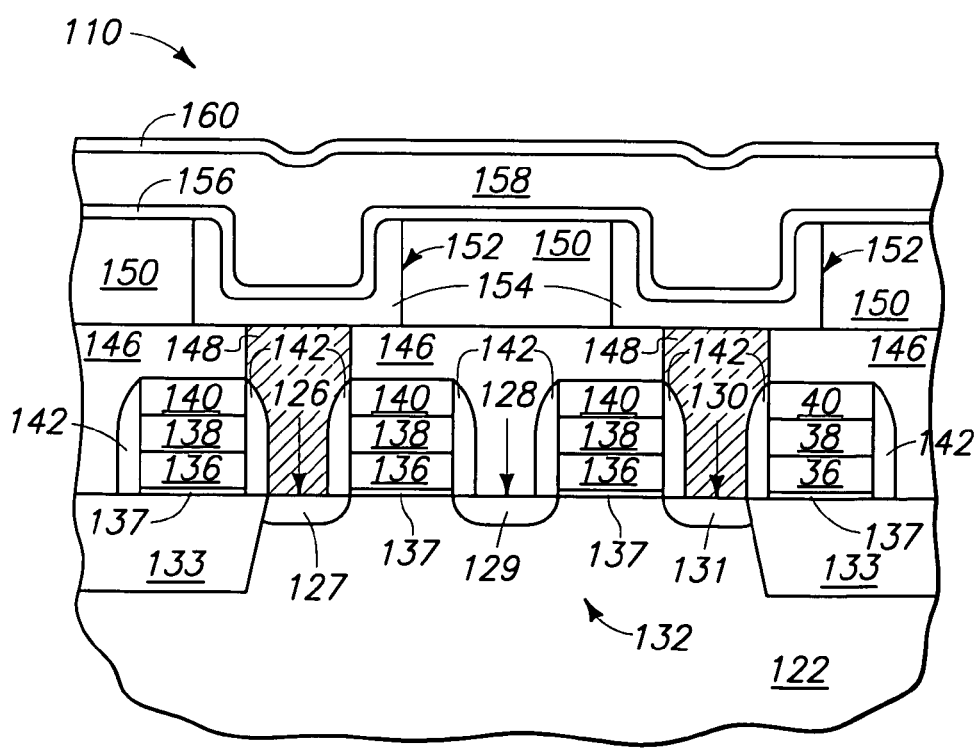
FIG. 16 is a view of the FIG. 15 wafer fragment at a processing step subsequent to that shown by FIG. 15.

Referring to FIG. 16, a silicon-nitrogen bond comprising layer 160 is formed over outer capacitor cell electrode 158.

Figure 17:
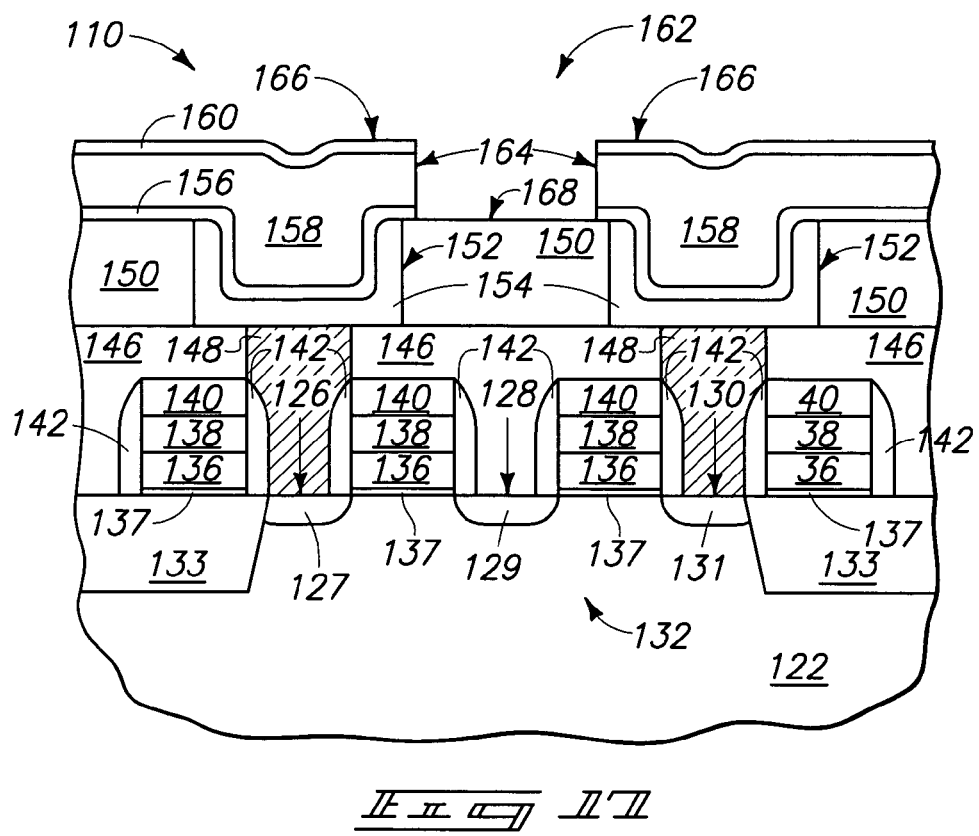
FIG. 17 is a view of the FIG. 16 wafer fragment at a processing step subsequent to that shown by FIG. 16.

Referring to FIG. 17, a bit contact opening 162 has been etched through silicon-nitrogen bond comprising layer 160 and through outer capacitor cell electrode 158. The etching depicted by FIG. 17 forms and exposes a sidewall 164 of outer capacitor cell electrode 158. By way of example only, FIG. 17 depicts the provision of silicon-nitrogen bond comprising layer 160 to have an exposed elevationally outermost first surface 166 comprising silicon-nitrogen bonds. Also by way of example only, FIG. 17 depicts providing bit contact openings 162 to comprise some base 168 which comprises an exposed second surface comprising at least one of silicon and silicon dioxide.

Figure 18:
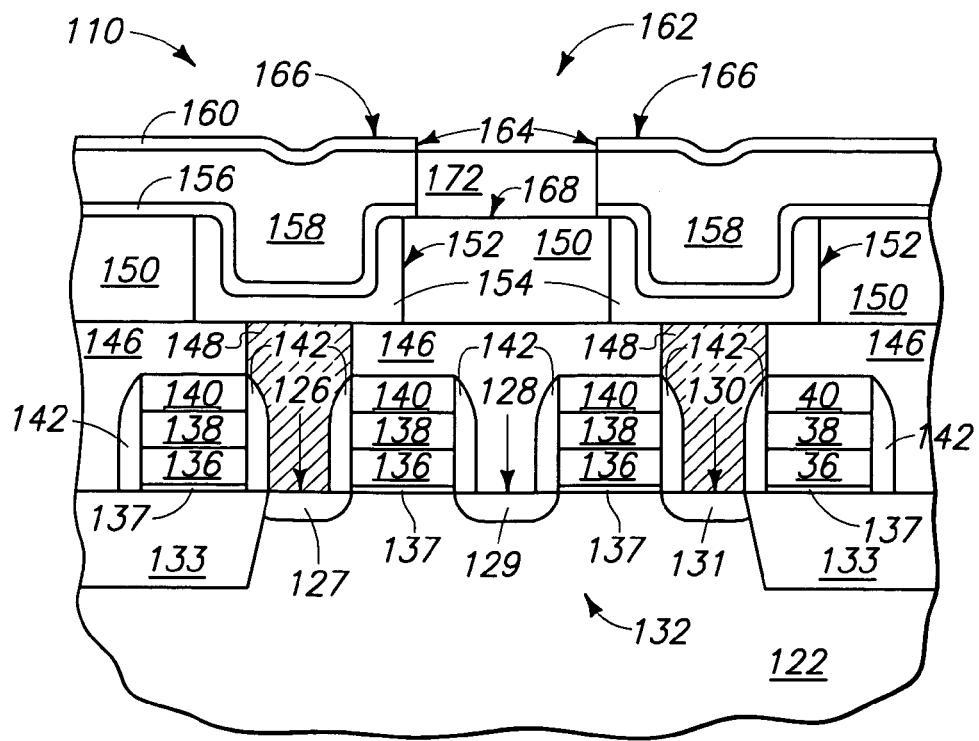
FIG. 18 is a view of the FIG. 17 wafer fragment at a processing step subsequent to that shown by FIG. 17.

Referring to FIG. 18, a silicon dioxide comprising layer 172 has been selectively deposited over outer second surface 168 as compared to outer first surface 166. An exemplary preferred technique for doing so is in accordance with the above described first embodiment, although this aspect of the invention is not so limited. By way of example only and not by way of limitation, exemplary prior art processing would blanketly deposit an insulative material over the entirety of the substrate, as opposed to providing layer 160 and the selective deposition of FIG. 18. Such can provide undesired added topography in conducting an ultimate bit contact etch, or require an additional planarizing step to remove such topography.

Figure 19:
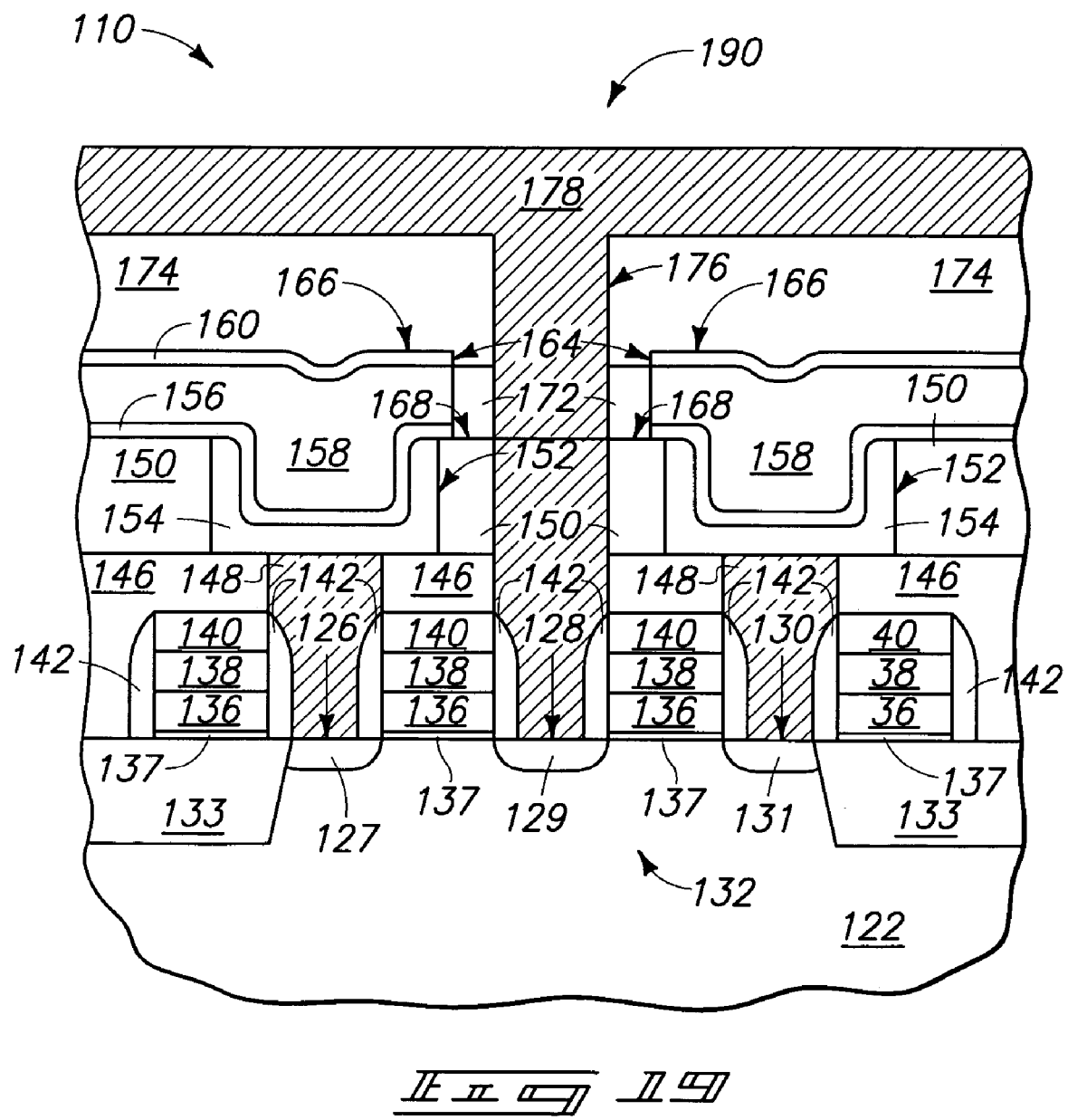
FIG. 19 is a view of the FIG. 18 wafer fragment at a processing step subsequent to that shown by FIG. 18.

Referring to FIG. 19, another insulative layer 174 (for example BPSG) has been deposited. A bit contact opening 176 has been etched therethrough to bit contact location 128/129. Such has been filled with a conductive material 178 (for example tungsten and barrier/glue layers), and has been patterned into a desired bit line 190.

Figure 20:
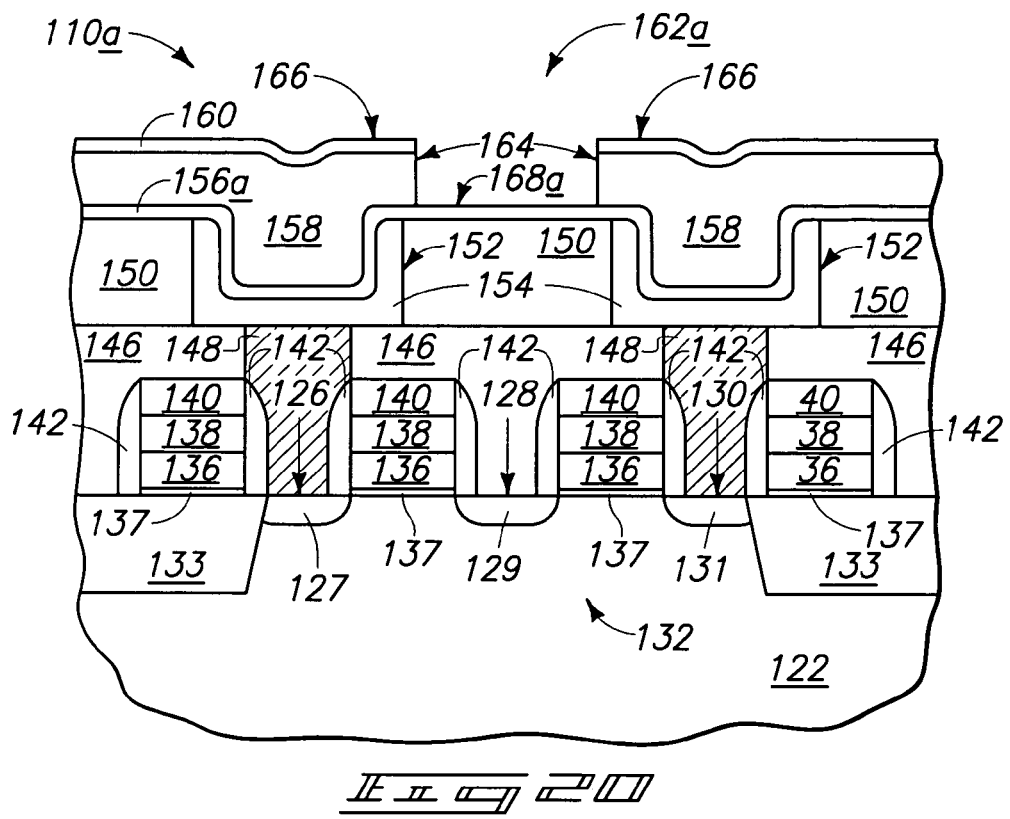
FIG. 20 is a view of the FIG. 16 wafer fragment at a processing step subsequent to that shown by FIG. 16, and an alternate to that shown by FIG. 17.

By way of example only, an alternate method of forming a bit line over a capacity array of memory cells is described with reference to FIGS. 20-22. Like numerals from the FIGS. 14-19 embodiment are utilized where appropriate, with differences being indicated with the suffix "a". FIG. 20 depicts a wafer fragment 110a at a process subsequent to that depicted by FIG. 16. In FIG. 17, the etching which forms bit contact openings 162 was conducted entirely through capacitor dielectric region 156 prior to the selectively depositing such that the exposed second surface 168 comprises an insulative layer which was beneath capacitor dielectric region 156 (i.e., BPSG layer 150). Here in FIG. 20, by way of example only, etching to form bit contact openings 162a has stopped somewhere on capacitor dielectric region 156a such that bit contact openings 162a do not extend entirely through capacitor dielectric region 156a. Capacitor dielectric region 156/156a might, of course, comprise any suitable layer or layers of dielectric material, whether existing or yet-to-be developed. Exemplary materials include nitrides and oxides, including, by way of example only, oxides and nitrides of silicon, aluminum and hafnium. Accordingly, exposed surface 168/168a, in some embodiments, might or might not comprise silicon-nitrogen bonds. Regardless, FIG. 20 depicts an example (as might FIG. 17) of providing the bit contact openings to comprise outer capacitor electrode sidewall portions 164 which comprise polysilicon.

Figure 21:
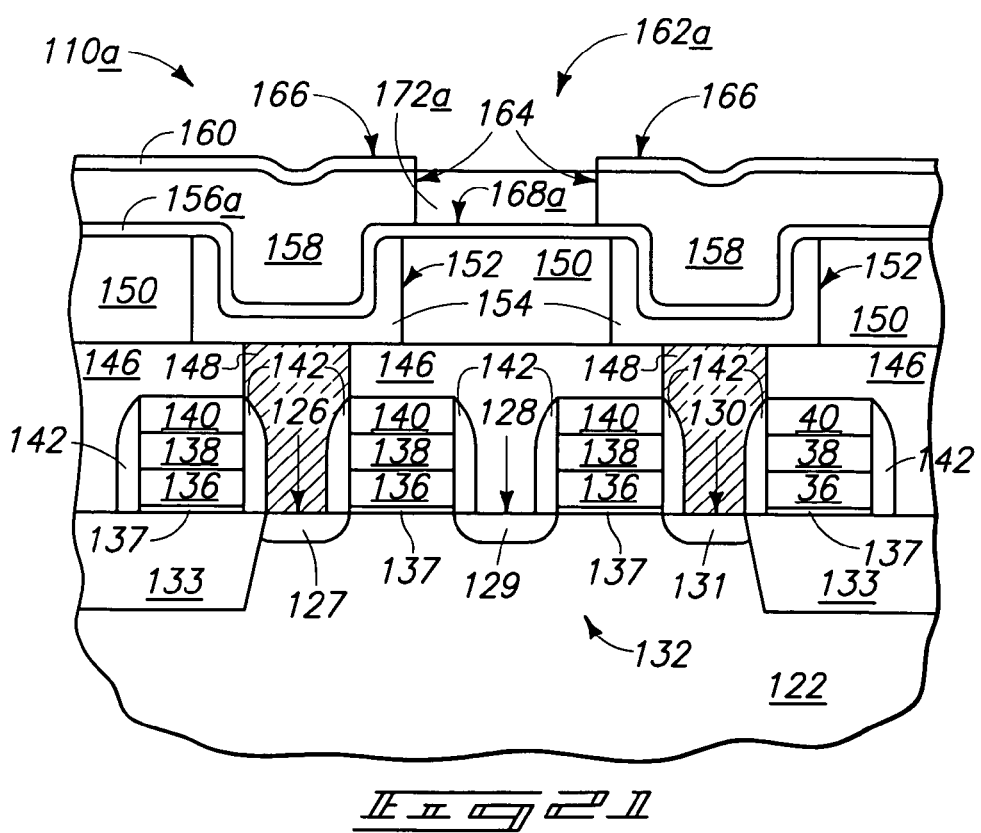
FIG. 21 is a view of the FIG. 20 wafer fragment at a processing step subsequent to that shown by FIG. 20.

Referring to FIG. 21, a silicon dioxide comprising layer 172a has been selectively deposited over polysilicon comprising sidewall portions 164 as compared to outer first surface 166. An exemplary preferred technique for doing so is in accordance with the above-described first embodiment, although this aspect of the invention is not so limited.

Figure 22:
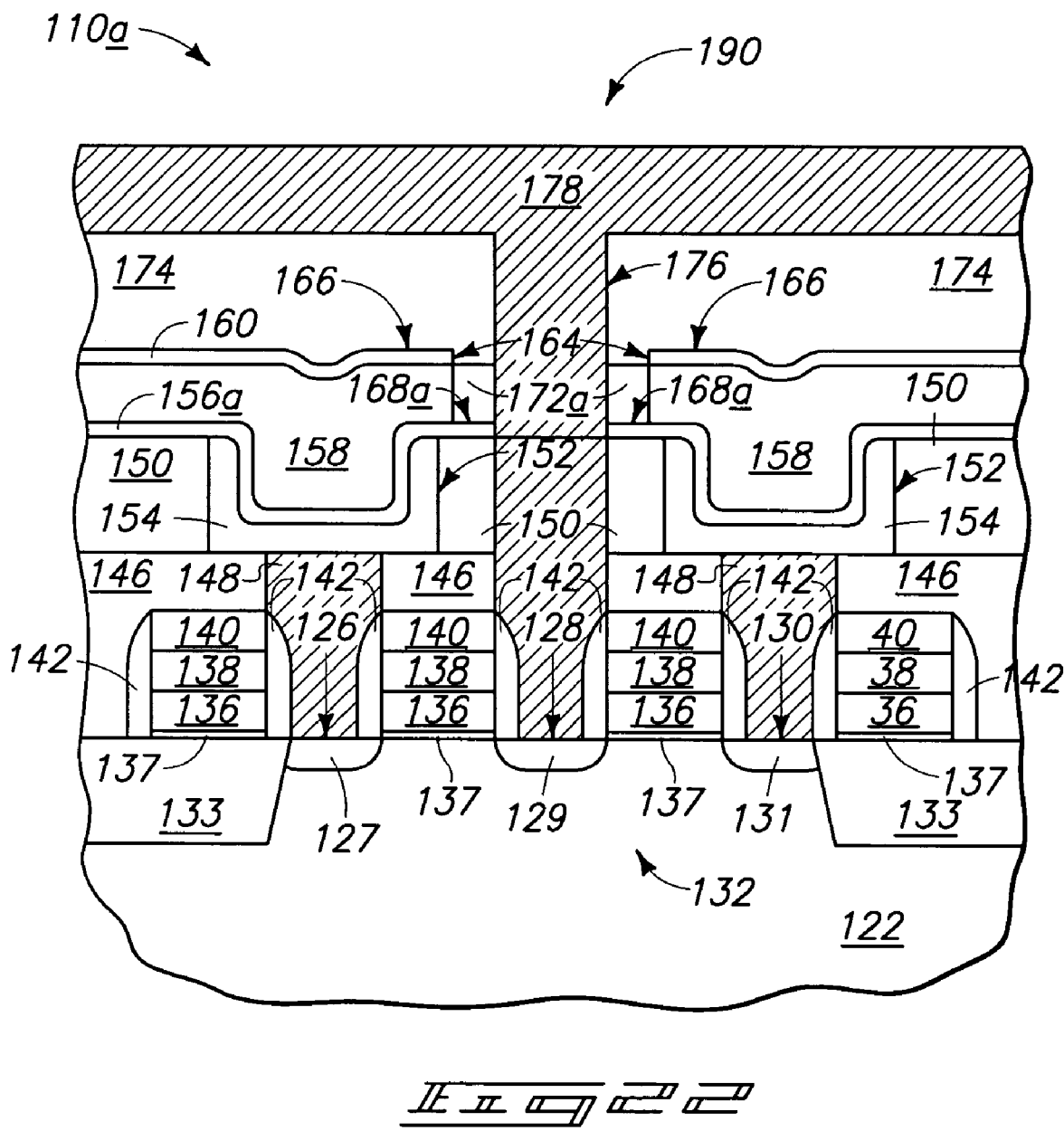
FIG. 22 is a view of the FIG. 21 wafer fragment at a processing step subsequent to that shown by FIG. 21.

Referring to FIG. 22, another insulative layer 174 (for example BPSG) has been deposited. A bit contact opening 176 has been etched therethrough to bit contact location 128/129. Such has been filled with a conductive material 178 (for example tungsten and barrier/glue layers), and has been patterned into a desired bit line 190.

Figure 23:
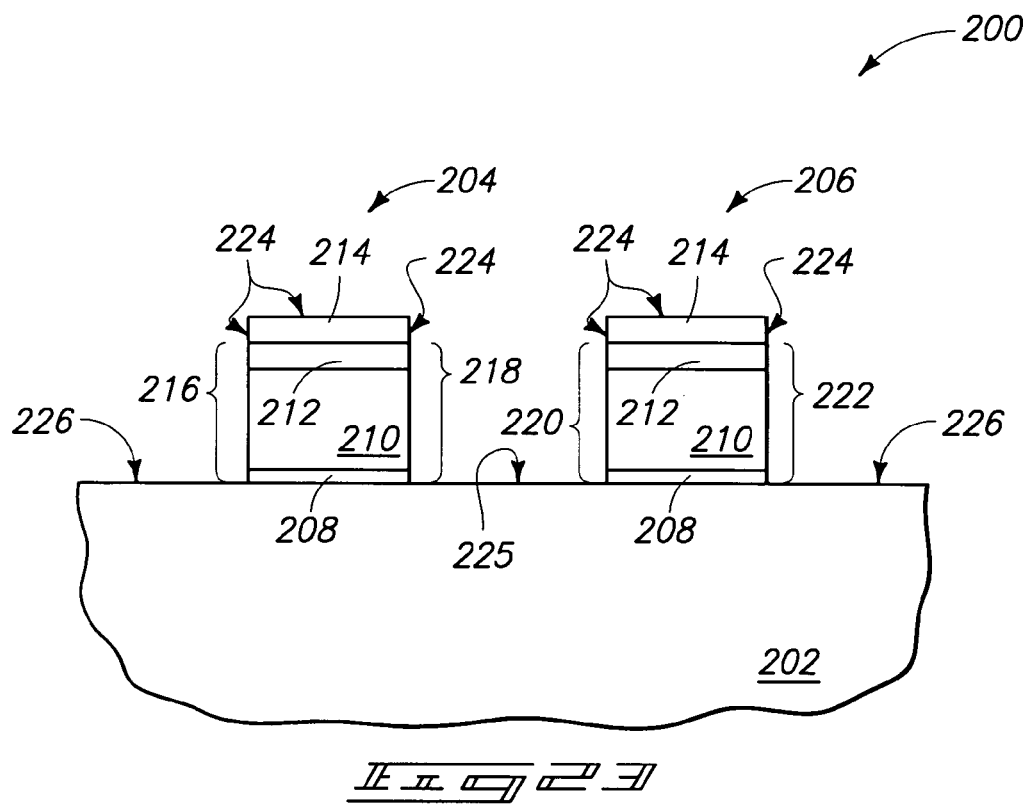
FIG. 23 is a diagrammatic sectional view of a semiconductor wafer fragment in process in accordance with an aspect of the invention.

By way of example only, another method of depositing a silicon dioxide comprising layer in the fabrication of integrated circuitry is described with reference to FIGS. 23-24. Referring to FIG. 23, a semiconductor wafer fragment in process is indicated generally with reference numeral 200, and includes a semiconductive substrate 202. A pair of spaced conductive line constructions 204, 206 is formed over substrate 202. Each is depicted as comprising layers 208, 210, 212 and 214. Exemplary preferred materials are elemental titanium for layer 208, elemental aluminum for layer 210, TiN for layer 212, and an insulative cap 214. Insulative cap 214 comprises silicon-nitrogen bonds, with exemplary preferred materials being silicon nitride and silicon oxynitride. Further by way of example, layer 208 might constitute a dielectric, for example silicon dioxide, with conductive line constructions 204 and/or 206 comprising conductive gate line construction of field effect transistors.

Conductive line constructions 204 and 206 can be considered as having conductive region sidewalls 216, 218, 220 and 222, as shown. Conductive region sidewalls 218 and 220 face one another, and are outwardly exposed. In the depicted exemplary embodiment, sidewalls 216 and 222 are also outwardly exposed. Insulative caps 214 comprise an exposed outer first surface 224 comprising silicon-nitrogen bonds. Semiconductor substrate 202 comprises an exposed outer second surface 225 extending between conductive line constructions 204 and 206. Exposed outer second surface 225 comprises at least one of silicon and silicon dioxide. Further in the depicted exemplary preferred embodiment, semiconductor substrate 202 includes exposed outer surfaces 226 laterally outward of conductive line constructions 204 and 206.

Figure 24:
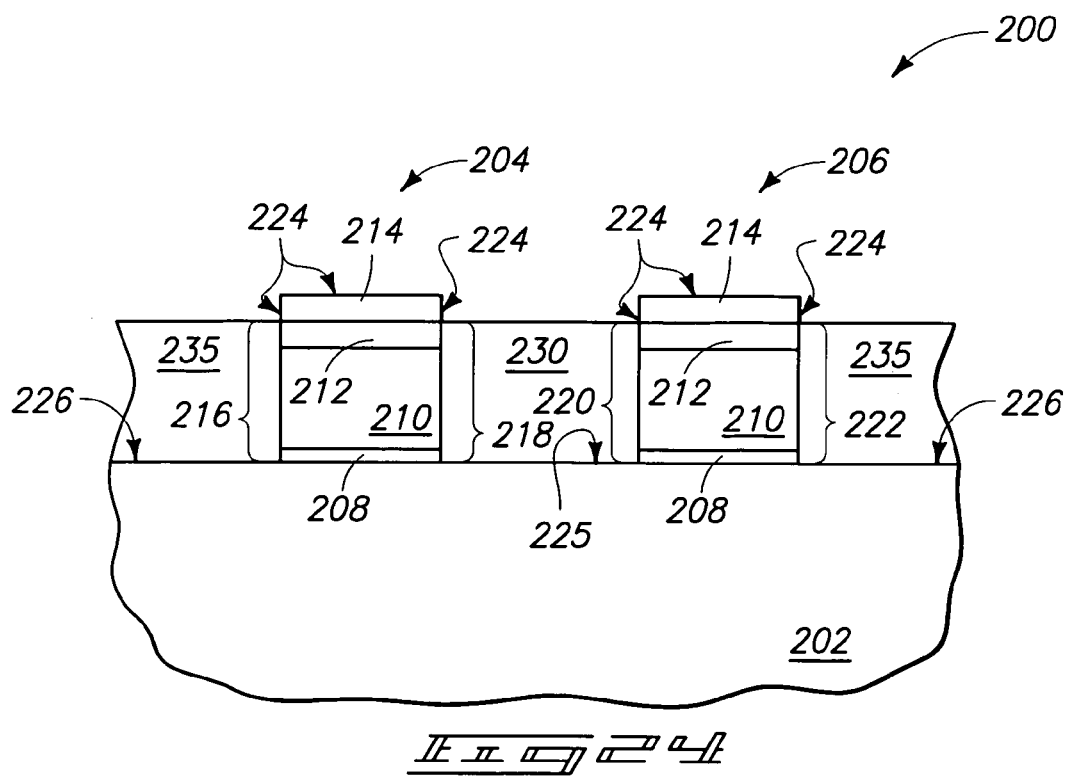
FIG. 24 is a view of the FIG. 23 wafer fragment at a processing step subsequent to that shown by FIG. 23.

Referring to FIG. 24, a gaseous silicon containing precursor and a gaseous oxygen containing precursor have been flowed to first surface 224 and second surface 225 effective to selectively deposit a silicon dioxide comprising layer 230 over outer second surface 225 as compared to outer first surface 224 and to cover facing conductive region sidewalls 218 and 220. Silicon dioxide layers 235 are also formed over lateral outer surfaces 226, as shown. An exemplary preferred technique for forming layers 230 and 235 is as described above with respect to the first described embodiment, whereby a layer comprising a metal is deposited over at least the outer second surface 225, and wherein a silanol is utilized. Such also provides an example wherein the oxygen and silicon containing precursors are in a single precursor (for example as is encompassed in a silanol). However alternately, the oxygen and silicon containing precursors might be encompassed by at least two precursors. All of the preferred attributes as described above with respect to the first preferred embodiment can preferably be utilized, although processing thereby is not limited in accordance with the broadest aspects of this implementation of an aspect of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of depositing a silicon dioxide-comprising layer in the fabrication of integrated circuitry, comprising:
   providing a semiconductor substrate having an exposed outer first surface comprising silicon-nitrogen bonds and an exposed outer second surface comprising at least one of silicon and silicon dioxide;
   atomic layer depositing a layer comprising a metal over at least the outer second surface; and
   flowing a silanol to the metal of the outer second surface and to the outer first surface effective to deposit a silicon dioxide-comprising layer over the outer second surface in a greater amount as compared to any amount deposited over the outer first surface.

2. The method of claim 1 wherein the metal comprises a metal compound.

3. The method of claim 1 wherein the outer second surface comprises silicon.

4. The method of claim 1 wherein the metal-comprising layer is no more than 4 monolayers thick.

5. The method of claim 1 wherein the outer second surface comprises silicon dioxide.

6. The method of claim 1 wherein the deposit is self-limiting to silicon dioxide-comprising deposition after completing said depositing the layer comprising the metal, and further comprising repeating said depositing the layer comprising the metal and said flowing the silanol at least once.

7. The method of claim 1 wherein the exposed outer first surface comprises silicon nitride.

8. The method of claim 1 wherein the exposed outer first surface comprises silicon oxynitride.

9. The method of claim 1 wherein the depositing the layer-comprising metal is in a greater amount as compared to any amount deposited over the outer first surface.

10. The method of claim 9 comprising treating at least the outer second surface prior to said depositing effective to enhance the said depositing of greater amount of the layer comprising metal over the outer second surface as compared to the outer first surface.

11. A method of forming trench isolation in the fabrication of integrated circuitry, comprising:
   forming a masking layer comprising silicon-nitrogen bonds over a semiconductor substrate;
   etching isolation trenches through the masking layer into semiconductive material of the semiconductor substrate;
   providing the masking layer to have an exposed elevationally outermost first surface comprising silicon-nitrogen bonds, and providing the isolation trenches within the semiconductor substrate to comprise an exposed second surface comprising at least one of silicon and silicon dioxide;
   atomic layer depositing a layer comprising a metal over at least the outer second surface; and
   flowing a silanol to the metal of the outer second surface and to the outer first surface effective to deposit a silicon dioxide-comprising layer over the outer second surface in a greater amount as compared to any amount deposited over the outer first surface.

12. The method of claim 11 wherein the exposed outermost first surface comprises silicon nitride.

13. The method of claim 11 wherein the exposed outermost first surface comprises silicon oxynitride.

14. The method of claim 11 wherein the providing comprises:
   forming a silicon nitride-comprising trench liner over semiconductive material sidewalls and semiconductive material bases of the isolation trenches; and
   anisotropically etching through the trench liner over the trench bases and effective to leave the trench liner over the trench sidewalls.

15. A method of forming trench isolation in the fabrication of integrated circuitry, comprising:
   forming a masking layer comprising silicon-nitrogen bonds over a semiconductor substrate;
   etching isolation trenches through the masking layer into semiconductive material of the semiconductor substrate;
   forming a silicon nitride-comprising trench liner over semiconductive material sidewalls and semiconductive material bases of the isolation trenches;
   anisotropically etching through the trench liner over the trench bases and effective to leave the trench liner over the trench sidewalls;
   providing the masking layer to have an exposed elevationally outermost first surface comprising silicon-nitrogen bonds, and providing the isolation trench bases to comprise an exposed second surface comprising at least one of silicon and silicon dioxide; and
   depositing a silicon dioxide-comprising layer over the second surface in a greater amount as compared to any amount deposited over the outer first surface, said depositing comprising atomic layer depositing.

16. The method of claim 15 wherein the exposed elevationally outermost first surface comprises silicon nitride.

17. The method of claim 15 wherein the exposed elevationally outermost first surface comprises silicon oxynitride.

18. A method of depositing a silicon dioxide-comprising layer in the fabrication of integrated circuitry, comprising:
   providing a semiconductor substrate having a field effect transistor gate construction, the gate construction comprising an insulative cover comprising an exposed outer first surface comprising silicon-nitrogen bonds;

providing the semiconductor substrate to comprise an exposed outer second surface proximate the gate construction comprising at least one of silicon and silicon dioxide; and flowing a gaseous silicon-containing precursor and a gaseous oxygen- containing precursor to the first and second surfaces effective to deposit a substantially undoped silicon dioxide-comprising diffusion barrier layer over the outer second surface in a greater amount as compared to any amount deposited over the outer first surface, said deposit comprising atomic layer depositing.

19. The method of claim 18 wherein the exposed outer first surface comprises silicon nitride.

20. The method of claim 18 wherein the exposed outer first surface comprises silicon oxynitride.

21. The method of claim 18 wherein the gate construction comprises a conductive region, the insulative cover covering all outer surfaces of the conductive region.

22. A method of depositing a silicon dioxide-comprising layer in the fabrication of integrated circuitry, comprising:

providing a semiconductor substrate having a pair of spaced conductive line constructions, the conductive line constructions respectively comprising an insulative cap and conductive region sidewalls, the insulative cap comprising an exposed outer first surface comprising silicon-nitrogen bonds, one of the conductive region sidewalls of one of the conductive line constructions facing one of the conductive region sidewalls of the other conductive line construction, the facing conductive region sidewalls being outwardly exposed;

providing the semiconductor substrate to comprise an exposed outer second surface extending between the pair of conductive line constructions, the exposed outer second surface comprising at least one of silicon and silicon dioxide; and flowing a gaseous silicon-containing precursor and a gaseous oxygen-containing precursor to the first and second surfaces effective to deposit a silicon dioxide-comprising layer over the outer second surface in a greater amount as compared to any amount deposited over the outer first surface and to cover the facing conductive region sidewalls, said deposit comprising atomic layer depositing.

23. The method of claim 22 wherein the exposed outer first surface comprises silicon nitride.

24. The method of claim 22 wherein the exposed outer first surface comprises silicon oxynitride.

25. The method of claim 22 wherein the conductive line constructions comprise field effect transistor gate constructions.

26. A method of forming a bit line over capacitor array of memory cells, comprising:

forming a layer comprising silicon-nitrogen bonds over an outer capacitor cell electrode;

etching bit contact openings through the layer comprising silicon-nitrogen bonds and through the outer capacitor cell electrode;

providing the layer comprising silicon-nitrogen bonds to have an exposed elevationally outer first surface comprising silicon-nitrogen bonds, and providing the bit contact openings to comprise bases comprising an exposed second surface comprising at least one of silicon and silicon dioxide; and depositing a silicon dioxide-comprising layer over the outer second surface in a greater amount as compared to any amount deposited over the outer first surface, said depositing comprising atomic layer depositing.

27. The method of claim 26 wherein the outer capacitor cell electrode comprises polysilicon, and a sidewall of which is exposed during the depositing; and the depositing forming the silicon dioxide-comprising layer over the outer surface in a greater amount as compared to any amount deposited over the exposed sidewall.

28. The method of claim 26 wherein the outer capacitor cell electrode is formed over a capacitor dielectric region, the etching forming the bit contact openings entirely through the capacitor dielectric region prior to the depositing such that the exposed second surface comprises an insulative layer beneath the capacitor dielectric region.

29. The method of claim 26 wherein the outer capacitor cell electrode is formed over a capacitor dielectric region, the etching stopping on the capacitor dielectric region such that the bit contact openings do not extend entirely through the capacitor dielectric region prior to the depositing and such that the exposed second surface comprises the capacitor dielectric region.

30. The method of claim 26 wherein the exposed outer first surface comprises silicon nitride.

31. The method of claim 26 wherein the exposed outer first surface comprises silicon oxynitride.

32. A method of forming a bit line over capacitor array of memory cells, comprising:

forming a layer comprising silicon-nitrogen bonds over an outer capacitor cell electrode, the outer capacitor electrode comprising polysilicon;

etching bit contact openings through the layer comprising silicon-nitrogen bonds and through the outer capacitor cell electrode;

providing the layer comprising silicon-nitrogen bonds to have an exposed elevationally outer first surface comprising silicon-nitrogen bonds, and providing the bit contact openings to comprise outer capacitor electrode sidewall portions comprising polysilicon; and depositing a silicon dioxide-comprising layer over the polysilicon-comprising sidewall portions in a greater amount as compared to any amount deposited over the outer first surface, said depositing comprising atomic layer depositing.

33. The method of claim 32 wherein the exposed outer first surface comprises silicon nitride.

34. The method of claim 32 wherein the exposed outer first surface comprises silicon oxynitride.

* * * * *